United States Patent
Rhoades et al.

(10) Patent No.: US 7,856,543 B2
(45) Date of Patent: Dec. 21, 2010

(54) DATA PROCESSING ARCHITECTURES FOR PACKET HANDLING WHEREIN BATCHES OF DATA PACKETS OF UNPREDICTABLE SIZE ARE DISTRIBUTED ACROSS PROCESSING ELEMENTS ARRANGED IN A SIMD ARRAY OPERABLE TO PROCESS DIFFERENT RESPECTIVE PACKET PROTOCOLS AT ONCE WHILE EXECUTING A SINGLE COMMON INSTRUCTION STREAM

(75) Inventors: John Rhoades, Bristol (GB); Ken Cameron, Bristol (GB); Paul Winser, Bristol (GB); Ray McConnell, Bristol (GB); Gordon Faulds, Gloucestershire (GB); Simon McIntosh-Smith, South Gloucestershire (GB); Anthony Spencer, Gloucestershire (GB); Jeff Bond, S. Glam (GB); Matthias Dejaegher, Bradley Stoke (GB); Danny Halamish, Bristol (GB); Gajinder Panesar, Bristol (GB)

(73) Assignee: Rambus Inc., Los Altos, CA (US)

( * ) Notice: Subject to any disclaimer, the term of this patent is extended or adjusted under 35 U.S.C. 154(b) by 434 days.

(21) Appl. No.: 10/073,948

(22) Filed: Feb. 14, 2002

(65) Prior Publication Data
US 2003/0041163 A1    Feb. 27, 2003

(30) Foreign Application Priority Data

| Feb. 14, 2001 | (GB) | ................................. 0103678.9 |
| Feb. 14, 2001 | (GB) | ................................. 0103687.0 |
| Sep. 10, 2001 | (GB) | ................................. 0121790.0 |

(51) Int. Cl.
*G06F 15/80*    (2006.01)

(52) U.S. Cl. ....................................................... 712/22
(58) Field of Classification Search .................. 712/18, 712/20, 22, 225, 11, 25
See application file for complete search history.

(56) References Cited

U.S. PATENT DOCUMENTS 4,755,986 A * 7/1988 Hirata ......................... 370/392
4,922,487 A * 5/1990 Eilenberger et al. ......... 370/411

(Continued)

FOREIGN PATENT DOCUMENTS

EP    0 992 895 A1    4/2000

(Continued)

OTHER PUBLICATIONS

"Router Architectures Exploiting Input-Queued, Cell-Based Switching Fabrics"; M. Ajmone Marsan and A. Bianco and P. Giaccone and E. Leonardi and F. Neri; Aug. 17, 2000.*

(Continued)

*Primary Examiner*—Eddie P Chan
*Assistant Examiner*—Keith Vicary
(74) *Attorney, Agent, or Firm*—Glenn Patent Group; Michael A. Glenn

(57) ABSTRACT

A data processing architecture comprising:
an input device for receiving an incoming stream of data packets; and
a plurality of processing elements which are operable to process data received thereby;
wherein the input device is operable to distribute data packets in whole or in part to the processing elements in dependence upon the data processing bandwidth of the processing elements.

33 Claims, 9 Drawing Sheets

U.S. PATENT DOCUMENTS

| | | | |
|---|---|---|---|
| 5,021,947 A * | 6/1991 | Campbell et al. | 712/25 |
| 5,224,100 A | 6/1993 | Lee et al. | |
| 5,325,493 A | 6/1994 | Herrell et al. | |
| 5,371,896 A * | 12/1994 | Gove et al. | 712/20 |
| 5,404,550 A * | 4/1995 | Horst | 712/14 |
| 5,418,970 A | 5/1995 | Gifford | |
| 5,420,858 A * | 5/1995 | Marshall et al. | 370/352 |
| 5,428,812 A * | 6/1995 | Yoshida | 712/201 |
| 5,440,550 A * | 8/1995 | Follett | 370/427 |
| 5,463,732 A * | 10/1995 | Taylor et al. | 345/505 |
| 5,603,028 A | 2/1997 | Kitsuregawa et al. | |
| 5,768,275 A * | 6/1998 | Lincoln et al. | 370/419 |
| 5,781,549 A * | 7/1998 | Dai | 370/398 |
| 5,872,993 A * | 2/1999 | Brown | 712/35 |
| 5,986,913 A * | 11/1999 | Childers et al. | 365/51 |
| 6,047,304 A * | 4/2000 | Ladwig et al. | 708/530 |
| 6,081,523 A * | 6/2000 | Merchant et al. | 370/389 |
| 6,088,355 A * | 7/2000 | Mills et al. | 370/392 |
| 6,094,715 A | 7/2000 | Wilkinson et al. | |
| 6,147,996 A * | 11/2000 | Laor et al. | 370/394 |
| 6,301,603 B1 * | 10/2001 | Maher et al. | 718/105 |
| 6,389,018 B1 * | 5/2002 | Clauberg | 370/394 |
| 6,393,026 B1 * | 5/2002 | Irwin | 370/401 |
| 6,704,794 B1 * | 3/2004 | Kejriwal et al. | 709/236 |
| 6,831,923 B1 * | 12/2004 | Laor et al. | 370/412 |
| 6,836,479 B1 * | 12/2004 | Sakamoto et al. | 370/389 |
| 6,907,001 B1 * | 6/2005 | Nakayama et al. | 370/230 |
| 6,963,572 B1 * | 11/2005 | Carr et al. | 370/401 |
| 7,016,367 B1 * | 3/2006 | Dyckerhoff et al. | 370/429 |
| 7,317,730 B1 * | 1/2008 | Devanagondi et al. | 370/412 |
| 2001/0018732 A1 * | 8/2001 | Nakagoshi et al. | 712/11 |
| 2002/0003795 A1 * | 1/2002 | Oskouy et al. | 370/389 |
| 2002/0075882 A1 * | 6/2002 | Donis et al. | 370/412 |
| 2002/0122424 A1 * | 9/2002 | Kawarai et al. | 370/394 |
| 2003/0074388 A1 * | 4/2003 | Pham et al. | 709/106 |
| 2003/0231627 A1 * | 12/2003 | John et al. | 370/389 |
| 2004/0017807 A1 * | 1/2004 | Dorr et al. | 370/389 |
| 2005/0243829 A1 * | 11/2005 | Spencer | 370/394 |
| 2010/0165991 A1 * | 7/2010 | Veal et al. | 370/392 |

FOREIGN PATENT DOCUMENTS

| | | |
|---|---|---|
| EP | 0992895 A1 | 4/2000 |
| JP | 2001-177574 | 6/2001 |
| WO | WO 92/15960 A1 | 9/1992 |
| WO | WO00/30322 | 5/2000 |

OTHER PUBLICATIONS

ISSC95 (Evening Discussion Session).Large-Scale Integration versus Multi-Chip Modules; This paper appears in: Solid-State Circuits Conference, 1995. Digest of Technical Papers. 42nd ISSCC, 1995 IEEE International; Publication Date: Feb. 15-17, 1995.*

"Input Queued Switches Cell Switching vs. Packet Switching"; Ganjali, Yasharl; Keshavarzian, Abtin; Shah, Devavrat; 2003.*

WO 97/29613 "Parallel on-the-fly Processing of Fixed Length Cells" Clauberg; Published Aug. 14, 1997.*

Rai et al. (Packet Processing on a SIMD Stream Processor); Network Processor Design, vol. 3: Issues and Practices, vol. 3 (The Morgan Kaufmann Series in Computer Architecture and Design); Morgan Kaufmann (Feb. 15, 2005); 26 pages.*

Seshadri et al. (A Case for Vector Network Processors); Proceedings of the Network Processors Conference West, Oct. 2002, 19 pages.*

Great Britain Search Report dated May 23, 2005, in connection with Great Britain Patent Application No. GB0506813.5.

Great Britain Search Report dated May 23, 2005, in connection with Great Britain Patent Application No. GB0506818.4.

* cited by examiner

US 7,856,543 B2

DATA PROCESSING ARCHITECTURES FOR PACKET HANDLING WHEREIN BATCHES OF DATA PACKETS OF UNPREDICTABLE SIZE ARE DISTRIBUTED ACROSS PROCESSING ELEMENTS ARRANGED IN A SIMD ARRAY OPERABLE TO PROCESS DIFFERENT RESPECTIVE PACKET PROTOCOLS AT ONCE WHILE EXECUTING A SINGLE COMMON INSTRUCTION STREAM

The present invention relates to data processing architectures, and in particular to single instruction multiple data (SIMD) architectures.

INTRODUCTION

It is widely expected that the Internet will be re-invented as a converged packet-based platform for new services, delivering all forms of digital material into all types of application domain. The new "Intelligent Internet" must be capable of supporting an unlimited number of new services, including but not limited to, Quality of Service levels, and associated paying business models. Furthermore, various is levels of protection of privacy and intellectual property, appropriate to the material and its use, must also be supported.

In addition bandwidth demands are increasing at least 2× per year, so this functionality will be required at line rates of 40 Gbit/s for multiple OC132 lines and for OC768.

The fast, intelligent, flow of digital material end-to-end is imperative. Embedded intelligence is required at the edge and in the core of the Internet infrastructure to provide processing that enables the services described above. Processing tasks carried out within the network are fundamentally different from the tasks for which current known Internet processing models were developed, and therefore call for a new architectural approach.

Network Processing is characterised by very high data rates, relatively simple processing requirements and hard real-time constraints. This specification uses the term "Data Flow Processing" to describe this class of problem.

Attributes of Data Flow Processing

Data throughput is the critical dimension, due to the fact that optical bandwidth is increasing faster than semiconductor capabilities. Software programmability, and hence flexibility, is vital, since requirements, functions and protocols will continue to evolve rapidly, threatening product lifetimes. Salability is essential as bandwidth levels move from core to edge. Finally, the complexity of the processing algorithms is limited, requiring that the processing architecture be optimised to avoid unnecessary, costly and power-consuming hardware functions.

There are many existing architectures that are optimised for different tasks. For example, for standard compute problems, a CISC or RISC processor may be most appropriate, while for media processing a DSP or VLIW architecture is the best fit. For the ultimate in performance, where flexibility is not required, a hardwired logic solution is preferred.

This specification outlines a new processor architecture that is suitable, specifically but not exclusively, for Data Flow processing problems. In this specification, this architecture is given the name "Multi Threaded Array Processing" (MTAP), which offers the speed of logic, the programmability of a CPU, and fast access to large amounts of local memory.

In its broadest concept, the MTAP architecture is a parallel data processing structure designed to directly address the bandwidth challenge. It presupposes, in a preferred embodiment, that, to perform advanced packet processing functions efficiently at 40 Gbit/s and above, whole packets must be stored on chip, very close to a large number of individual processing elements. The "intelligent memory" design of the MTAP architecture follows directly from this approach of being "bandwidth-centric", rather than "code-centric".

Adaptation of Established Architectures

Current approaches to Network Processing all involve attempts to adapt established architectures to the needs of Data Flow Processing.

Multiple (possibly modified) RISC cores are being used to bring programmability and some level of parallel execution to the task. However, these retain the inherent overhead of the computational tasks for which they were originally designed, relying on serial processing through each RISC core. The lack of a formalised parallel processing framework results in a complex, heterogeneous, multiple-program software environment, making scalability almost impossible. ASIC approaches are being used for speed but have very long design times and large up-front design costs, while offering neither programmability nor scalability.

Hybrid approaches combining some of each of the above are being attempted, but they combine the disadvantages as well as the advantages.

SUMMARY OF THE PRESENT INVENTION

The solution to the above problems of Data Flow Processing addressed by the present invention has been designed from first principles to provide the optimal balance between the conflicting demands of speed and programmability. The MTAP architecture uses different types of parallelism at every level to balance data throughput and processing power. There is an industry trend to strip off overhead from CPU-like processors to form small efficient packet processors that can then be replicated in parallel. Applicants have taken this to the next stage, at least in the preferred implementation, by factoring out all of the common overhead such as instruction fetch and decode, and memory latency.

As a result, very large numbers of highly optimised Processing Elements (PEs) can be harnessed with a minimum of hardware overhead.

According to one aspect of the present invention, there is provided a data processing architecture comprising:
  an input device for receiving an incoming stream of data packets; and
  a plurality of processing elements which are operable to process data received thereby;
  wherein the input device is operable to distribute data packers in whole or in part to the processing elements in dependence upon the data processing bandwidth of the processing elements.

DESCRIPTION OF THE PREFERRED EMBODIMENTS

Figure 1:
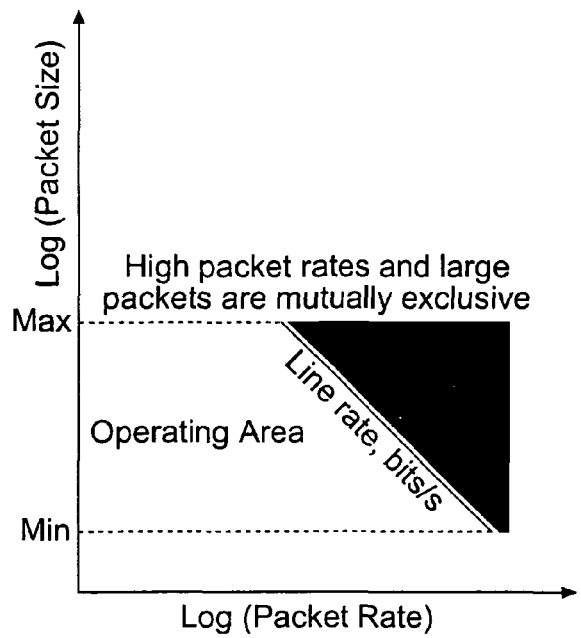
FIG. 1 illustrates packet rate vs packet size.

Embodiments of the present invention are designed to provide an example of a single Network Processor that operates at 40 Gbit/s under worst-case conditions, namely lookups on every packet, various different packet lengths including all minimum size, and a mixture of protocols. The present invention can, for example, be scaled down to support 10 Gbit/s at lower cost, or scaled up to support 80 and 160 Gbit/s line cards, without any change in software. End-to-end system latency is predictable, and well within Quality of Service requirements. This is achieved through a is combination of the highly structured MTAP architecture, executing a single program, and various techniques that have not been applied to parallel processing before.

The Processor Cluster

The central component of the embodiments of the present invention is an MTAP processor. This is a high performance, configurable and programmable building block that conforms to the VCI specification for virtual components. In order to optimise performance and bandwidth, a number of processors are connected together as a "cluster".

A cluster uses a small array of identical MTAP processors, each typically running the same program (although asynchronously).

In one aspect, the invention encompasses a processor comprising a cluster of identical MTAP processors running the same program.

Each individual processor has a high level of internal parallelism to achieve the necessary bandwidth and data processing capability. This parallelism is largely transparent to the user—for example, programs are written in C, with extensions to represent the highly parallel data structures processed by the architecture.

Each MTAP processor contains an array of identical, small, efficient Processing Elements (PEs), scalable from dozens to hundreds for different performance points.

In another aspect, the PEs all execute the processor's single instruction stream, but are able to make independent data-driven decisions.

Each PE is tightly coupled to its own embedded memory to optimise system throughput. The result is effectively a high-speed "intelligent memory" system that rapidly processes data passing through it. For example, in one embodiment, with a 32-bit port between its register file and local memory, one PE at 4001 MHz has a memory bandwidth of 12.8 Gbit/s. A cluster with 256 such PEs has an aggregate bandwidth of 3,270 Gbit/s, all with single cycle latency. Importantly, the MTAP processor also has hardware support for multi-threading to allow effective use of resources, overlap of I/O and processing, and to simplify programming. Exemplary individual PEs are very small: a PE with 4 KB of memory is about $\frac{1}{10}^{th}$ the size of a typical 32-bit embedded RISC core. Although there is an overhead for the controller in each processor core, once the array size gets to around 8 PEs the overall size of the processor is comparable to other architectures. For the number of PEs used in the network processing solution described here, this architecture is significantly more area efficient than any known approach.

The Processor-Memory Balance

A processor architecture for advanced programmable packet processing must deliver on three points:

1. It must directly address the line rate bandwidth, and should have a clear scalability path for future rates.

2. It must provide the raw horsepower for complex data classification, profiling and modification functions, on the maximum packet rate that the line bandwidth may deliver. That processing power must also scale with increasing function demands.

3. It must store the whole packet 'close' to the processing for efficient implementation of processing up to layer 7.

The above requirements are only satisfied by parallel processing architectures. A naive approach would be to provide a large number of general purpose processors, sufficient to satisfy requirement (2) for the highest packet rate encountered, and to give each one enough embedded local memory in order to satisfy requirement (3) for the maximum packet size encountered. However, this approach will result in a design that is too large, and consumes too much power, to be feasible. This approach fails to recognise that maximum packet rate and maximum packet size are never encountered simultaneously. In fact, by definition, the product of the packet rate and packet size, as measured over some period of time, will never exceed the line rate. This is illustrated in FIG. 1, where the operating area of the Network Processor always lies below the 'load line' of the input line rate.

It follows from this argument that processing and storage should be allocated by bandwidth, not by packet, to avoid the inefficiency of a system that is over-engineered for operation "above the line". The MTAP architecture allocates a number of Processing Elements, and corresponding storage, to each packet, sufficient for its storage.

In a further aspect of the invention, the MTAP processor as a whole handles a variable number of packets, but a fixed allocation of bandwidth.

This bandwidth-centric approach to packet processing makes optimal use of hardware resources and provides a predictable and deterministic flow of packet data through the system, with very low levels of jitter and inherent preservation of the packet order.

Packet Processing Architecture

The highly parallel MTAP architecture provides the horsepower needed for advanced packet processing, while the PEs' closely coupled local memories provide the on-chip storage or packets with very low access latency and enormous aggregated bandwidth.

The instruction set used to program the processor is optimised for the algorithms required in the specific Data Flow Processing application. The fact that all PEs and, is usually all processors, execute the same program preserves the programming simplicity of a uniprocessor model.

Processors and Accelerators

The MTAP cluster operates on many data items (e.g. hundreds of packets) simultaneously. Entire packets are loaded into the processors. This provides the bandwidth and performance required for flexible processing at very high packet rates. The hardware overhead of programmability is low due to the architecture.

To complement the MTAP processor cluster, a number of accelerators (specialised hardware engines) provide maximum efficiency for the "simple" (or not so simple) common functions of packet processing, such as table lookups. Their performance derives from a pipelined design with some parallelism where required. They typically consist of embedded or external memory with hardware state machines. An integral part of the Network Processor is the Table Lookup Engine (TLE). The TLE supports up to 1 million table entries, key sizes from 32 to 129 bits, and multiple mixed protocols. It maintains lookup rates for 40 Gbit/s line speeds under worst case conditions.

Communication between the processor cluster and the accelerators is itself pipelined over an on-chip network that, in this specification, is termed the ClearConnect™ bus. The I/O structures of the processor perform the parallel to serial conversion and vice versa. Individual PEs may selectively access the hardware accelerators. Dedicated I/O engines allow transfer of packet data between PE local memory or hardware acceleration units external to the cluster as a background operation. To make efficient use of the processing power, bandwidth and high degree of concurrent operation, the processor includes hardware support for multithreading. This gives the programmer a simple way of programming and co-ordinating the parallel functions. The MTAP processor, ClearConnect bus, TLE and other supporting hardware accelerators can be configured by Network Processor System-on-Chip designers to support their particular product plans.

Network Processors built using the inventive technology will offer dramatic improvements in Data Flow Processing performance under both ideal and worst case conditions, while doing so with significantly fewer ICs than any other approach. They will also scale simply over a wide range of performance levels.

An example of a generic processor according to this aspect of the present invention will be described later.

Latency to Memory

Programmable processors suffer stalls from memory latency, which limits their performance. Placing memory close to the processor (like a cache) can overcome this, but the functions of classification, routing, and traffic management on very large numbers of packet flows requires the storage of considerable quantities of state information (e.g. routing tables).

This is too much to couple tightly to every processor. Instead, the state must be pooled into large memories accessed by multiple processors that therefore incur contention and latency in their access to it.

In this context, it should be noted that memory access latency is different to the overall latency of a packet through a Network Processor, which will typically include a number of memory access latencies plus the time for the actual processing of the packet.

The management of memory latency is key to making an efficient architecture for Data Flow Processing. Traditional approaches, of memory hierarchy and caching, fail to address is this problem fully in a packet processing system. The MTAP architecture solves the problems of latency by exploiting the characteristics of the ClearConnect bus and the use of multi-threading in the processor.

Multi-Threading and Parallelism

Multi-threading can be applied to a processor to enable it to perform useful work while waiting for a memory access to complete. Unfortunately, when applied at the level of individual packets, the determinism in processing is broken and this results in loss of packet order.

Part of a preferred feature of the present invention involves the application of multi-threading at a higher level to avoid this problem. The processing sequence is explicitly programmed in the multi-threaded fast-path code, and thread switches apply to a whole batch of packets being handled in parallel by a processor. While the global memory accesses for all packets are serialised and pipelined across the ClearConnect bus, the processor thread-switches and then executes another processing task that can operate on state held internally to the PEs. Exposing this mechanism to the programmer makes efficient operation of the system simple to achieve in high level software. The result is that when a processor accesses a global memory block, the memory accesses are efficiently overlapped with useful work on the PEs. Also, there is only a single memory latency cost for any number of accesses—the latency of all but the first access being overlapped with previous accesses, thus a high degree of immunity to memory latency can be achieved.

Further, the order of packets is preserved because they maintain a uniform and consistent flow through the system, as they would in a hardwired ASIC design. This also maintains much lower levels of packet jitter than in other programmable architectures. Access from processors to is hardware accelerators is performed in exactly the same way as access to global memory. Again, the individual accesses are serialised and pipelined through the accelerator via the ClearConnect bus. The accelerators can then simply be accessed as address-mapped peripherals by the software.

Programmability and Performance

According to the invention, the processing of a packet is performed in the MTAP architecture as a series of pipelined accesses to common functions implemented as separate hardware accelerators, programmed and driven by the processor cluster.

Because of the powerful processing capability of the highly parallel MTAP architecture, all of the custom set-up and computation required by particular packet protocols can be performed in software.

This allows the basic low-level functions such as table lookup and string search to be defined in very general forms, ideal for implementing in relatively simple but high performance pipelined hardware engines. The highly parallel and multi-threaded nature of the processor cluster provides strong immunity to the latency of these accelerators and the associated memory. By exploiting parallelism at many levels, the architecture combines the best of both worlds—the flexibility of software defined-processing with the efficiency of custom hardware design. This solution provides the power needed for 40 Gbit/s packet processing with clock speeds around 400 MHz. The inherent efficiency provides this capability with reasonable silicon cost and power dissipation. In an exemplary application of the invention to be described later in this specification, a single chip performs a rich set of fast path processing for 100M packets per second at 40 Gbit/s. The chip is estimated at 295 mm$^2$ in area and 17 W in dissipation in a 0.13 g process.

Processing Element Allocation

A packet is allocated to a number of PEs sufficient for its storage. A number, one or more, of individual PEs are thus available to perform useful work on that packet. For many functions, however, only the packet header is required for processing, and in this case only the PE containing the header content will be activated. The others remain idle in a power saving mode. Although this results in lower utilisation of PEs, the allocation scheme provides optimum use of the embedded memory for packet storage.

According to this aspect of the invention, a processor comprises a plurality of parallel processor elements, each adapted to store part of a packet, the processor being adapted to operate in a power saving mode in which only the processor element containing the packet header is activated. Since the Processing Element itself is simple and small, it is the memory cost that dominates, and therefore needs to be optimised. This would not necessarily be the case for more complex processors with wider data paths and their own dedicated instruction pipelines.

For processing functions that address the entire packet payload, such as string search operations for layer 7 processing, all PEs containing segments of a packet may be activated. Furthermore, the number of PEs applied to a packet is proportional to its length, and thus processing resources are optimally applied, in the same manner as storage. Adjacent PEs have close-coupled inter-processor communication paths that provide a low cost means of sharing and aggregating the results from individual PEs simultaneously with the parallel processing itself.

Figure 2:
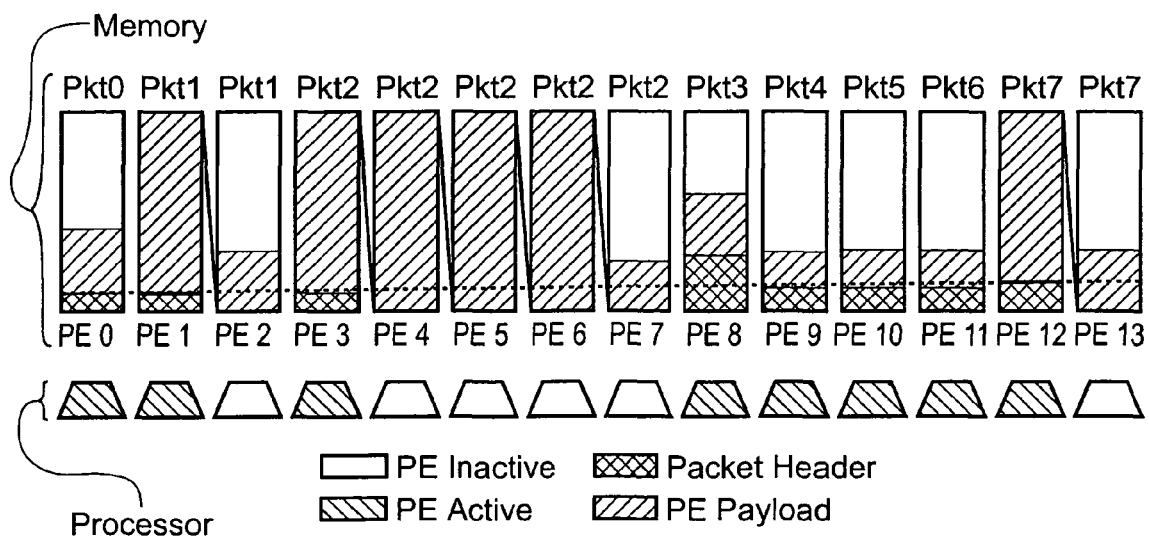
FIG. 2 illustrates allocation of packets to processing elements.

FIG. 2 shows a variety of packets distributed over a number of PEs. Traffic management functions may map packets onto PEs in the same way as for classification, routing etc. This need not be the case, however. The fine-grained parallelism of the MTAP architecture is its key to scalability. Up to 256 PEs can be contained per MTAP processor, without affecting the software and without introducing problems of complex distribution, reordering and shared resource contention that traditional code-centric architectures incur.

Packet-Optimised Processing Elements

The PEs themselves are optimised for the operations commonly performed on packet data, queue states and statistical information. They contain an 8-bit ALU datapath optimised for bit manipulation instructions, coupled to 32-bit wide 4 Kbyte local memory via a register file. PEs are arranged in a linear logical structure and each PE has direct communication to its two neighbours.

An 8-bit wide ALU is well matched to the majority of Network Processor operations. For example, in an IPv4 header, all fields that may require modification are 4, 8 or 16-bits wide. Conversely, the 32-bit wide local memory is suited to larger fields such as IP source and destination addresses that typically do not require modification. Other protocols, such as IPv6, MPLS and IPSEC, have similar characteristics, with 8-bit and 16-bit fields dominating.

The 8-bit ALUs are thus better optimised for packet processing than 32-bit or 64-bit alternatives. Their small size enables larger numbers to be employed because the incremental cost of adding PEs is small. The system architecture is designed to allow easy configuration of their number for different price/performance points.

Bringing large numbers of PEs to bear on the packet flow allows each PE a significant number of cycles for processing a packet. For example, at 40 Gbit/s, minimum size packets of is 48 bytes (with typical framing) arrive every 9.6 ns. If allocated to, say, 256 PEs however, 2.4 µs is available per PE per packet, and at 400 MHz this equates to 983 cycles, sufficient to do useful work in software.

Traffic flows encountered in reality, however, typically consist of both large data packets and small acknowledge packets, providing more time for Processing. Conversely, more complex processors may perform more work per clock cycle, but the wider word sizes will be under-utilised and waste power. The overhead of instruction issue hardware for every processor also consumes more power and means that far fewer CPUs can be placed on a chin. The fine-grained parallel structure of the MTAP processor lends itself to using redundancy techniques to reduce chip cost. This is routinely done in memory chips but is not usually economic with logic chips. The addition of a few extra PEs to a processor, together with the logic to 'wire out' defective ones, i.e. redundancy, can make significant yield enhancements.

A number of processor cores can be combined to work efficiently together within the overall Platform This is described in more detail below.

Packet Order and Parallelism

The pipelined accesses from the processor to system memory or hardware accelerators may return results out of order, if that function is itself implemented in a parallel form. That is, the order of results for different packets may be scrambled in the low-level pipeline operation. However, as results are returned serially over the ClearConnect bus, they return to the processor and each is individually directed to the PE that requested that result.

This effective serial to parallel conversion is therefore immune to results returning out of order. Once all results have returned across the ClearConnect bus, the processor can continue processing them in parallel. The result of this is that breaking the order at a hardware component level does not cause any reordering of packet flows themselves. This forms another aspect of the invention.

Any architecture that uses parallel hardware or memory structures to achieve the necessary bandwidth is subject to this problem. Many prior art solutions implement a reordering buffer somewhere in the system to restore the original packet order. Instead of adding this unwanted overhead to the system, the MTAP architecture of the present invention uses the storage of its PEs to perform this reordering as part of the fundamental Data Flow Processing solution.

According to this aspect of the invention, the processor operates in such a way that the storage capability of the individual PEs in the processor is utilised to re-order packets returning from an accelerator.

This uniformity of processing and data flow creates a system with a degree of determinism, approaching that of a hardwired solution. It is straightforward to verify the worst case performance of the system, since it is far less statistical in nature than, for example, a large cluster of independent CPUs whose performance is regulated by their cache miss behaviour. For the same reason the level of packet jitter introduced by the system is low, and this is increasingly important for packet flows containing streaming media data such as VoIP.

Layer 7 Processing

Layer 7 processing will require two basic abilities. The first and simpler, is to look for information at fixed locations, created by layer 7 applications such as FTP, deep within payloads. The second, more powerful, is to examine a payload within a packet, match this against a number of strings and, depending on matches, perform actions such as replacing the matched string with another. This sort of processing allows very sophisticated routing of packets using, for example, URL information. Without this capability, layer 7 processing is limited, but together these capabilities allow for URL load balancing and usage based accounting.

One aspect of the present invention provides a solution that allows for either of the capabilities above.

Accordingly, the architecture loads entire packets into the PEs, not just the first few bytes. This enables searching to be done at any point within a packet, a major requirement for true layer 7 processing.

In addition, the string searching capability of this aspect of the invention allows matching and replacement of these strings, as well as statistics gathering.

For examining data fields or up to several bytes in size, at calculable locations (not necessarily fixed), the Table Lookup Engine is sufficiently powerful to perform these layer 7 lookups in conjunction with layer 3-4 classification, while maintaining 40 Gbit/s line rates. Searching longer sections of packet data, or searching for large numbers of strings in a search pattern, requires the addition of the String Search Engine. For a given implementation of this scalable hardware engine, line rate processing can be maintained by trading of the following factors:

Length of the string to be searched.

Calculation of the location of the string to be searched.

Length of the pattern to search the string for.

Parallel Processing Architectures

There are two main approaches to designing parallel processing systems. The most common, and conceptually the simplest, is the Multiple instruction Multiple Data (MIMD) model. This uses multiple processors operating in parallel: each processor executes its own program and operates on different data. MIMD architectures generally use shared memory for common program and data storage.

The alternative approach is Single Instruction Multiple Data (SIMD) where a number of simpler processing elements all execute the same instruction at the same time. Each processing element performs the same operation on different data.

Traditional MIMD Limitations

The MIMD model of parallel processing is popular because of its apparent simplicity. However, it has a number of problems. The design of the processors themselves is often inherited from general purpose computation CPUs which are poorly optimised for a specific task such as packet processing. They are typically optimised to maximise the number of instructions issued per clock, with complex instruction pipelines and instruction and data caches implemented in hardware.

In small numbers, these processors can form attractive solutions to processing problems, but as their number increases to meet higher performance points their deficiencies can become a serious problem. In particular the hardware overhead of instruction storage and issue is typically a high proportion of the processor cost. When multiplied up in a large scale MIMD system, this overhead can dominate the area of a chip. In addition, multiple processors that are operating independently must compete for resources such as shared memory. Arbitration between large numbers of processors can be costly both in hardware and the resulting efficiency of performance scaling. It is increasingly difficult to connect more than 16 processors to a single memory, and yet 40 Gbit/s packet processing demands higher performance that can only achieved with greater numbers.

Developments to improve the efficiency of MIMD processor arrays, such as adding multithreading to conventional CPUs, are partially self-defeating since the increased complexity only adds to the hardware overhead in each processor—area that is better spent directly on transferring, storing and Processing packet data.

Traditional SIMD Limitations

Traditional implementations of the SIMD model have found limited applicability. This has been mainly due to the difficulty of mapping an algorithm or task on to a large number of processors that all perform identical operations. As a result, there are currently two classes of SIMD architectures.

The first class includes systems such as the Connection Machine, Maspar, DAP, and ICL development that spanned the 1970-1990 era. These machines were called massively parallel because they had literally hundreds to thousands of processing elements. These were typically 1-bit processors, but some later versions went to 8-bit processors. With the technology available, these machines were very expensive and filled large equipment racks. They were also designed as general purpose computation devices, which severely limited their efficiency for any particular application. More recently, a new tradition has arisen, starting with Intel's MMX™ extensions, of embedding a very few (typically 4 or 8) SIMD execution units within a traditional microprocessor to speed up certain operations, multimedia for example. In both of these cases, the SIMD execution units were driven at a cycle level by a more traditional processor. In short, the SIMD arrays are coprocessors rather than independent processors, whether they have few or many processing elements. They also rely on a 'pure' SIMD model, with each data item subjected to exactly the same operation. In many applications, packet processing included, this would result in severe inefficiency where data items require-different operations to be applied. These traditional implementations are also dependent for their data on the I/O system of the main processor, which is often not optimized for the multiple data model. Intel has introduced on the Pentium III™ its Streaming SIMD capability, which better matches the CPU's I/O mechanisms to the SIMD processing power.

MTAP: Beyond SIMD and MIMD

In contrast, the architecture of the present invention combines the best features of MIMD and SIMD whilst avoiding the problems of both.

The flexibility of MIMD is used in the processor cluster's small array of independent processors. By keeping the number of processor cores small, the scalability problems of MIMD are bypassed. Multi-threading, combined with the overall system design, especially the ClearConnect bus described below, minimises the problems of contention for shared resources.

In its preferred implementation, and in accordance with a further aspect of the invention, each MTAP processor is a complete, self-contained PE array that typically includes a fairly large number (tens to hundreds) of Processing Elements.

The MTAP processor has its own optimised controller with instruction fetch, caches and I/O mechanisms. It operates is autonomously, and can run large programs written in high-level languages or assembler code. The processor is not a general purpose computation device but is optimised for the demands of high bandwidth Data Flow Processing. This simplifies the hardware and increases efficiency For example, only a fast linear inter-PE communication structure is required, not a mesh as is necessary for applications such as image processing.

This application optimisation also allows a simpler high level language compiler to be more effective (e.g. auto vectorisation is not required).

In addition, a number of non-traditional capabilities have been added to the processor, going beyond the limited simple SIMD processing model and allowing it to be applied to tasks where the array of data items cannot simply be processed with a sequence of identical operations. These techniques fall into two broad areas:

1. Data driven modification of operations at the PE level, which allow different PEs to handle different protocols, for example. This includes predication, memory indexing, selective I/O and addressing modes.

2. Control structures that maintain optimum operation of the MTAP processor as a whole. These include global data-driven instruction flow and thread switching, and program-controlled overlap of parallel I/O operations and processing.

Combined with novel software control techniques within the cluster as a whole, in the individual MTAP processors, and at the level of individual PEs, this advanced development of the SIMD hardware model can exceed the efficiency of alternative architectures, even when the packet stream demands a variety of different protocols to be applied.

Fundamental Implementation of the Invention

Many embedded computing-systems must process an incoming stream of data, or produce an outgoing stream of data, or both. Often these streams are "real time" in that the processing system is not able to define the time that data arrives or leaves, or the exact rate at any moment. Such systems include the processing of data from sensors or transponders, radio communications systems, radar, sonar, audio and video media streams, or network data. A characteristic of some of these types of streams is that the data is 'framed' into self contained segments termed datagrams, and that these datagrams may either be of fixed or varying size in a stream. Often, specialised processor architectures are used to handle these continuous data streams effectively.

Many of these problems are tackled with 'DSP' solutions, which involve dedicated hardware or programmable processors optimised for efficient processing of signal data streams. A typical DSP system has a programmable processor containing several memory buffers. In order to maintain constant data streams in to and out of the DSP processor, two DMA engines are employed, under control of the processor. The first DMA engine streams data from the system input, often via a FIFO buffer, to one half of a double-buffered section of memory in the processor. The processor has access to the data in the other half of the buffer in order to process it. The two halves of the input buffer can be swapped so that there is always memory for input data to arrive in, and there is always data for the processor to work on. The second DMA engine works in exactly the same way but transferring data from one half of a double-buffered memory in the processor to the system output, again sometimes via a FIFO.

Where high levels of processing performance are required, parallel or pipelined processor architectures are employed. To achieve the highest levels of performance, massively parallel architectures may be the only solution. The SIMD model is the most efficient way of managing large numbers of processors, but is not readily applicable to stream based data processing. The variable length of the datagrams in the stream do not fit well with a model where processors are performing identical tasks, on identically sized data. In one embodiment of the present invention, a processing architecture is described in which one or more massively parallel SIMD processor engines can be efficiently deployed to process stream based data.

The processing architecture is described as a set of 'building blocks', including some which are optional for particular applications. This modular approach makes the architecture particularly flexible for building a variety of solutions at a System on Chip level.

Basic Solution

Streams of datagrams flow between processors. However, the transfer of these datagrams between processors cannot be direct. Processors must operate independently of each other, retrieving, processing and forwarding datagrams at their own rates. Furthermore, processor architectures and operating characteristics can result in these rates being non-uniform over time. The key to supporting processor independence is to insert memory based data buffers into every data path to de-couple the behaviours of each processor in the system from one another. Data buffers thus play a central role in enabling multiprocessor architectures to operate on continuous streams of data. They also facilitate system design by presenting standard interfaces which support well understood system operating principles (as described in the preceding section).

The use of data buffers for simple de-coupling in this way is not, by itself, inventive. The Inventiveness of this aspect of the invention lies in the way that data buffers car be designed to meet the unique requirements of SIMD processors whilst at the same time presenting robust and intuitive interfaces which are compatible with non-SIMD processors.

The following sections describe how a system is organised to enable intercommunication to be controlled in such a manner.

Data Format

This concerns a connection level protocol for forwarding streams of datagrams.

Consider a real time stream of data comprising datagrams of arbitrary and variable length. These datagrams are processed and forwarded individually. This is straight-forward for conventional MIMD architectures as a single processor can handle an entire datagram at a time. In SIMD architectures, however, the memory resource per processing element is limited and therefore fine grained distribution of datagrams across processors is necessary. Datagrams which are read from data buffer blocks by SIMD processors may thus be fragmented. Fragments, or 'chunks' as they are referred to from hereon, are a fundamental characteristic of the proposed SIMD based system architecture for data stream processing according to this aspect of the invention.

Important concepts applicable to datagram chunking are:

Chunks must be identifiable with respect to each other and with respect to the datagram to which they collectively belong. Every chunk is assigned a header for this purpose. The header incorporates a chunk length (identifies end of chunk) and two flags which identify whether the chunk is the first or last chunk of a datagram.

Chunks may only contain a single datagram, or a single fragment of a datagram since processors do not operate on more than one datagram at a time.

As a chunk may also contain a single complete datagram, chunking can be used as a basis for system wide datagram management whereby the system comprises MIMD and SIMD processors alike. Unlike SIMD, MID processors could read single datagrams of any length as single chunks.

System Organisation

A system in which all data flows in chunked form must be bounded. Boundary nodes must add chunk headers to datagrams entering the system, and remove headers from datagrams leaving the system. Although data buffers could be designed to straddle this boundary and perform chunking operations, it is preferable to define domain interface entities that encapsulate the chunking operations and any application specific functions. This then introduces two essential concepts:

A system domain sits within an application domain. Datagrams transferred in the application domain are translated at the system domain boundary into chunks. The transfer of data in the system domain is thus controlled.

There is a taxonomy for classifying entities in the system domain into Four different groups:

Processors—always initiate datagram transfers within the system domain. They are initiators.

Interfaces—sit on the system domain boundary. They also initiate datagram transfers and are initiators.

Data buffers—targets which sit between processors and interfaces (or processors and processors)

Peripherals—Any entity in the system domain that does sit in the path of datagram streams.

Data Transfer Modes

The next step is to define how the flow of chunks through the system should be managed. Chunks provide a means of controlling the transfer of datagrams at the connection level—in a sense, a presentation format. However, the datagram itself remains the primary subject of interest. Processors act on whole datagrans. Data buffers forward datagrams.

Initiator to target transfer—When written to, data buffers consume datagrams in whatever chunked form they arrive in, de-chunk them and reconstruct the datagram.

Important characteristics to note are:

Processors, MIMD and SIMD alike, can output datagrams to data buffers in any chunked form as long as chunks are legitimate (eg. have appropriate headers and contain a single datagram or single fragment of a datagram). Chunk order of output datagrams should be preserved.

If multiple buffers are implemented in the data buffer then datagrams destined for different buffers may arrive in chunk interleaved format.

A datagram is only advertised to the data buffer output port (producer) when it is fully loaded into the buffer.

If the buffer overflows during the storage of a datagram then the remaining chunks are discarded and the partially stored datagram is purged from the buffer.

Target to initiator transfer—When read from, data buffers produce datagrams in a chunked form that is specified by the processor requesting the data. Two types of read operation are supported by data buffers for this purpose. The important concepts relating to Processors reading and writing data from/to data buffers are therefore that:

Processors read datagrams using a 'batch read' mode. In a batch read, the processor issues a standardised request to the data buffer to send chunks. The request primarily is specifies the number of chunks and the maximum chunk size. The fact that the processor retains control of the transfer means that a system architecture is possible in which different, independent processors (SIMD and/or MIMD), in the same system could request data in different chunk sizes from the same data buffer.

Additionally, the processor can specify conditions which the data buffer must comply with. One such condition might specify whether datagrams may be split between batch read requests, i.e. whether the request should be terminated prematurely if a datagram cannot be transferred in full within the specified number of chunks. The addition of conditions make this a powerful feature. This conditional transfer by the data buffer under the instruction of the SIMD processor is a key feature of the SIMD data streaming architecture.

System Control

In the same way that processors exchange datagrams via shared data buffers, they can synchronise their activities and exchange control information via a shared resource called the Global Semaphore block. This block is used for high level software control to synchronise or force order between processor accesses to shared data buffers.

Interrupts

Control information can also pass between processors and data buffers. While it is the processor's responsibility to request and manage the transfer of datagrams to and from data buffers, it is necessary for the data buffers to inform the processors when they contain datagrams which the processor may wish to read. In a traditional architecture, interrupts may be used for this purpose. An interrupt from a data buffer could stimulate a SIMD processor to issue a batch read or a MIMD processor to issue a conventional read in order to retrieve a datagram from the buffer memory. Semaphores are proposed in place of interrupts as a more generic mechanism that can achieve the same result.

Direct Memory Access—Transfer

In the batch read mode both chunk header and payload are delivered into the processor memory. This may not be desirable in all cases as more conventional processors may wish to read the control information first and then the payload (datagram) data. This is achievable as follows. When data buffers remove chunk headers and reconstruct datagrams, they store datagrams in a memory and retain information from the chunk headers separately. The datagram in addressable memory can thus be accessed directly by conventional memory read. Thus, the flexibility to be able to deliver datagrams to processors on request in subtly different formats is provided.

The invention therefore encompasses this aspect.

Data buffer functions in the SIMD data streaming architecture can accommodates this mode of operation thus enabling combined SIMD/MIMD systems.

Conventional read modes are also used by SIMD processors to access peripheral blocks that do not sit on data paths.

Direct memory access—in-situ processing This can be regarded as an extension to DMA1. Data buffer memory could be used as a working memory on which the processor may operate—eg for large packets.

Embodiment of Solution—NP Application

A specific implementation of the invention, in one particular context, has been outlined in the embodiment of the solution as described in section 1.2 of the co-pending application No GE 0102678.9, particularly in the design of data buffer blocks. Detailed descriptions of the data transfer modes, global application of the chunking scheme, and the architecture and operation of proposed data buffer blocks are found in chapter 3 of the co-pending application.

In summary, the fundamental elements of this aspect of the invention are:

SIMD data flow processing concept—system organisation The broader use of chunking and the casting of this technique in a more generic format. Chunking is used to manage the exchange of datagrams between any two entities in the data flow processing system domain.

The definition of a system boundary on which boundary interfaces perform chunk/dechunk and application specific operations SIMD Data Flow Processing Component Toolkit—

The most important component is the data buffer block. All manner of data buffer block types may be constructed from a set of basic modules. These modules collectively present a possibility for an inventive concept of a data buffer IP platform/toolkit for the design of data buffers to support SIMD based data streaming SoC design. The main components of the data buffer toolkit are:

The producer—The producer module intelligently services SIMD batch requests and interprets the various conditions. It is the embodiment of the important SIMD specific Batch read mode.

The Buffer Manager

The Control Interface Module

The toolkit components may be built into the following specific Data Buffer blacks:

Distributor (Single stream data buffer)—used for managing single data flows that are distributed to multiple SIMD processors arranged in parallel. Alternatively, the distributor may multiplex together multiple input streams or similarly act as a convergence point for a tributary flow joining the main flow.

Collector (Single stream data buffer)—used for managing single data flows which are collected from multiple SIMD processors arranged in parallel.

Datagram Exchange block (Multi-stream data buffer)—a software configurable datagram router which can be used to set up any required data stream path through the SoC without resource contention.

Toolkit can also be leveraged to assist in the design of interface entities in which chunking and dechunking occurs.

For example:

Control Plane Interface—The CPI block reuses the databuffer block toolkit IP to provide DMA and chunk/dechunk functions.

The combination of the component blocks (data buffer blocks, SIMD/MIMD processors, interfaces) and the system organisation concepts (chunking) gives the basis for the complete SIMD data flow processing architecture—the overall concept of using SIMD processor blocks to provide high power processing of continuous data streams.

In its most fundamental implementation, the network processor according to one aspect of the present invention includes an array of programmable, parallel SIMD processors associated with hardware accelerators.

Figure 3:
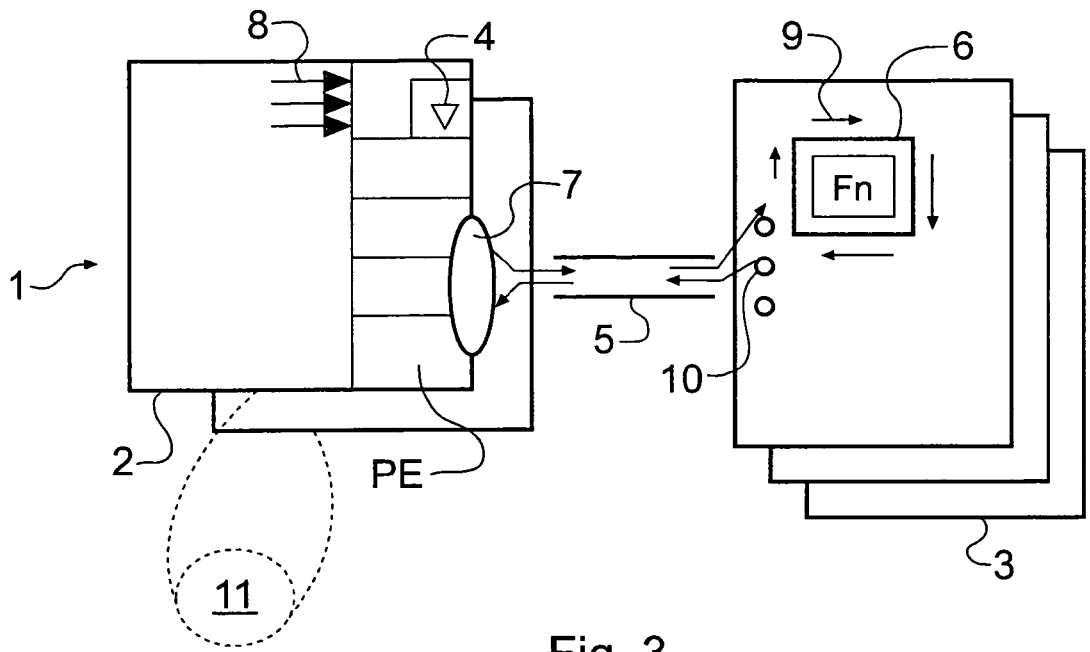
FIG. 3 illustrates one embodiment of the present invention.

The generic system and its preferred manner of operation are described with reference to FIG. 3.

The basic part of the system comprises a programmable SIMD processor 1, consisting of parallel processor arrays 2 and hardware accelerator blocks 3. Each processor comprises a plurality of SIMD Processor Elements PE. The PEs operate on independent data 4 contained in local PE memory. A more detailed description follows later in the specification. One or more fixed functions 6 may be cast as hardware accelerator blocks. For the sake of illustration only, without limiting the present invention in any way, the functions may include a table lookup or a floating point unit. Although the functions in the accelerators are fixed, they may nevertheless be configurable. Conversely, variable and/or complex functions are optimally carried out in programmable SIMD. In other words, the functional requirements of the processor map into SIMD for the variable and/or complex functions and into the accelerators for the fixed, common, invariant (but configurable) functions. Data transfer between the SIMD PEs and the accelerator blocks is serialised over a pipelined bus 5, i.e. it is bi-directional. As well as whole arrays participating in data transfer between the accelerators and the PEs, individual PEs may elect to participate in such data transfer.

Parallel-to-serial conversion, for transfer from the PEs to the accelerators, is carried out within the SIMD, as indicated at 7. Similarly, serial-to-parallel conversion for data transfer from the accelerators to the PEs is also carried out within the SIMD, as also indicated at 7. Transfer may occur in both directions simultaneously, for example when the PEs are reading from the accelerators. The SIMD may have multi-threaded execution (the code to the PEs is multithreaded), as indicated at 8, so that useful work can be conducted whilst transfer is currently taking place, thereby overcoming the potential for long latency in access to the accelerators. In other words, the mechanism controlling I/O operation is independent of execution. Data transfer occurs independent of SIMD processor operation once the transfer instruction has been given.

Depending on the function performed by an accelerator, it may be deep pipelined and/or parallel in design. In this way, data may pass sequentially through the function block(s) in the accelerator, as indicated at 9, or it can be duplicated in parallel via respective function blocks indicated diagrammatically at in the accelerator. One advantage of this is that the accelerators can continue to receive data from the PEs without having to respond.

The accelerators may return data to PEs in a different order to which it was received from them. It will then be necessary to have a mechanism to deal with the potentially arbitrary order of returning data. One example of such a mechanism may include tagging requests with unique IDs. One SIMD may access multiple accelerators across a shared bus. In addition, one accelerator may be accessed by multiple SIMD units across a shared bus without interference. In order to maximise utilisation time and thereby reduce peak performance needs, multiple SIMD units may phase their access to a common accelerator. This can be done through synchronisation, indicated generically at 11, either internal or external to the SIMD, so as to interlock access. For example, the Global Semaphore Unit in the aforementioned co-pending application could be extended in order to implement the algorithm necessary to achieve such synchronisation.

The accelerator/SIMD combination may be selected to perform any given function, as previously mentioned. One such implementation may be to perform Table Lookup, as more fully described in the above-referenced co-pending application. In this guise, the SIMD/accelerator combination performs the function of the Lookup Table Engine TLE (or LUT).

The present invention therefore encompasses any or all of is the above features singly or in combination.

One exemplary application yet to be described illustrates this in more detail in the case of IPv4. IPv6 and MPLS. A cluster containing a small array of MTAP processors (typically around 4) is used in the construction of a Network Processor. The total number of PEs required for a particular price performance point is divided between them. The advantage of using several processor cores in a cluster are lower latency, more even distribution of the I/O and table lookup loading, and the ability to gracefully deal with exceptional cases.

However, because each MTAP processor has many times the performance of a traditional microprocessor, only a small number are required for packet processing at line rates of 40 Gbit/s. Moderate numbers of these processors may be deployed to meet faster line rates of 100 Gbit/s or 160 Gbit/s, whereas practical problems of scalability may be encountered attempting to scale multi-CPU architectures to the very large numbers that they would require.

MTAP Processor Structure

Figure 4:
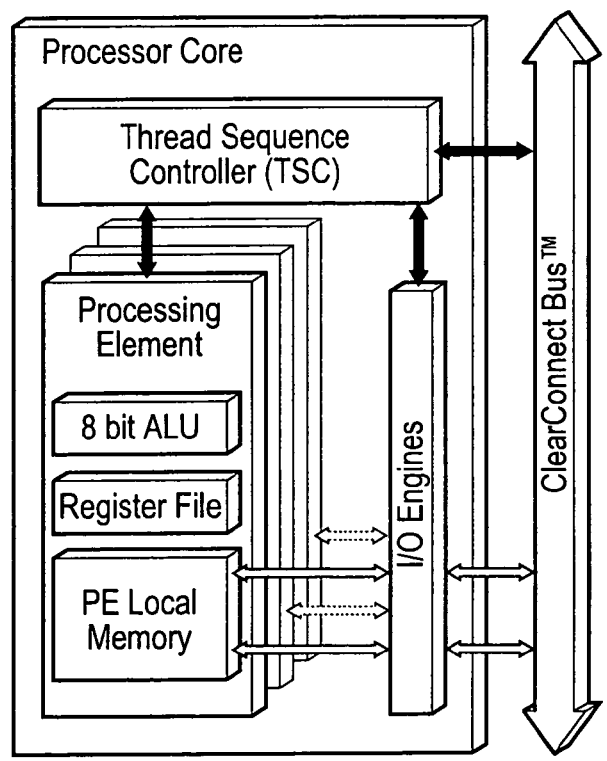
FIG. 4 illustrates a processor embodying an aspect of the present invention.

FIG. 4 shows the top level structure of one MTAP processor according to a preferred implementation of this aspect of the invention. A single hardware multi-threaded Thread Sequence Controller (TSC) manages the issuing of instructions to the PE array and the I/O engines. The TSC has a configurable size instruction cache. Thread switching is programmed in software and may be triggered in response to events such as the completion of an operation by one of the I/O engines. The I/O paths themselves are configured to run in excess of the system line rate bandwidth. Both the number and function of these I/O engines are configurable options on the processor core.

Hardware Accelerators

In addition to the MTAP processor architecture described above, the invention contains a number of dedicated hardware engines, or accelerators, to perform specific operations at maximum efficiency. These blocks have been made as general and configurable as possible in order to maximise their utility to a wide range of applications. They conform to the VCI specification for interoperability.

The processor cluster that drives these hardware accelerators has the power to perform the application setup of input data and processing of output data at wire speed. In addition, multi-threaded execution facilities a high degree of immunity to the latency of access to these blocks. As a result, it has been possible to simplify these hardware engines down to their functional essence and implement them as deep pipelines Table Lockup Engine (TLE)

The generic lookup table solution is suitable for applications requiring in excess of 100 million lockups per second. A configurable combination of embedded SRAM or DRAM plus external DDR SEM devices can be employed to meet different table sizes and key length requirements.

The invention therefore also encompasses a table lookup engine implemented by the network processor architecture.

Details of an earlier solution may be found in our earlier UK Patent Application No GB 0103678.9 previously referenced. However, for completeness, a description of an implementation of the present invention in the guise of a TLE now follows.

Lookup Tables

Figure 13:
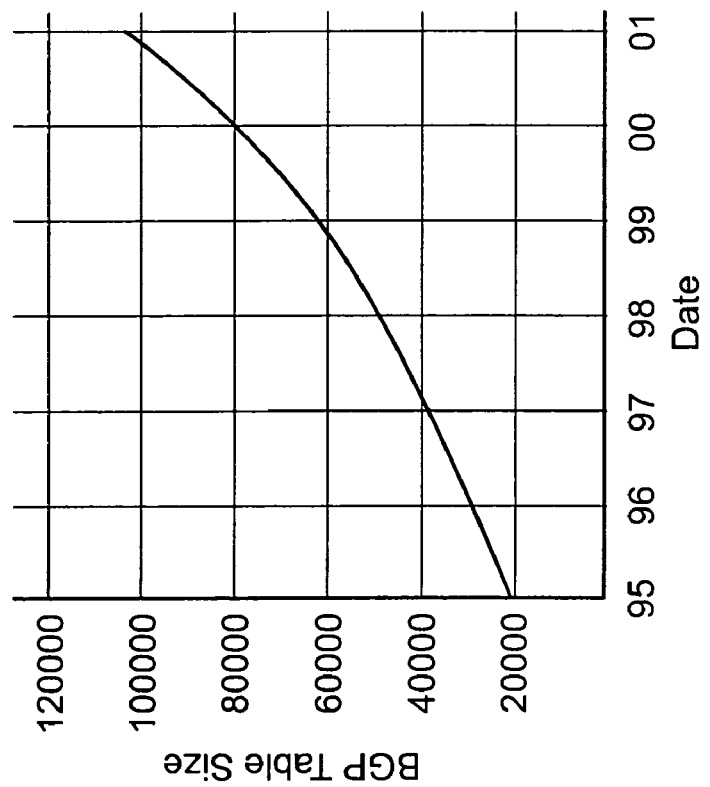
FIG. 13 shows BGP table size.

The lookup table in a router is used in the simplest case to discover where packets should be sent. Routing information described in protocols such as BGP4 and OSPF is stored in the table. As a packet is being forwarded, a key is constructed from some information in the packet. This may just be the destination IP address of the packet, but can be much more complex. This key is then presented to the lookup table. The lockup table holds (key, value) pairs, the result of any lookup being the value that matched the presented key. For example, the lookup result may be the output port number this packet should be routed to for its next hop across the Internet. Routing tables are increasing in size. Typical IPv4 core routing tables are already 100,000+ entries. It is expected that the next generation of tables will provide one million entries in order to support multiple protocols. FIG. 13 shows the trend in BGP routing table sizes.

A common form of lookup table is the CAM, or Content Addressable Memory. Currently available CAMs are able to provide over 60 million lookups per second with table sizes of about 100,000 entries. Devices due this year will provide over 100 million lookups per second for small tables. However, the number of entries available per device will mean that several devices (8-16) will be required to build million entry tables. These devices are typically provided in 400-500 pin packages.

Continuing to use CAMs, although providing the performance required, is at the cost of more devices, with corresponding cost in board space and power requirements. Furthermore, CAMs often use a specialised memory technology requiring more complex, and thus expensive, fabrication processes.

The Table Lookup Engine (TLE) is part of the Network Processor. The TLE uses a proprietary variation of the Level Compressed trie algorithm (LC-trie), with improvements including reducing the number of memory accesses required per lockup. The LC-trie algorithm works by traversing a tree structure held in memory. Each branch in the tree requires a memory access. Level compression causes branches to vary in depth and this results in lookups requiring a variable number of memory accesses. The key to an efficient LC-trie Implementation is to maximise the bandwidth to the table memory. The present TLE achieves this in two ways. Firstly, the TLE employs multiple banks of memory across which the table data is distributed. The number and size of these banks are tuned to the performance requirement. The banks of memory can be either on chip or off chip, or a hybrid mixture of both, with no specific type of memory predicated. Embedded SRAM may be chosen over DRAM if the former is available sooner. However, DRAM may be chosen for better density, if it is available on the chosen process. Secondly, the TLE drives these memory banks using a configurable number of independent Lookup Elements (LEs). Each simple hard-wired LE is able to completely traverse the tree, accessing any of the banks as required. The number of LEs is selected to ensure that the utilisation of the memory is maximised.

Exploiting Parallelism

Typically, ASIC-based pipelined solutions require fixed lockup latency. The massively parallel approach in the MTAP processor does not enforce such a restriction. Instead, it allows other units in the system the freedom of variable latency, and in the case of the TLE, to return results out of order from the requests without causing out of order processing of the packets.

Software

Equally important is the control software provided. Much of the complexity of the solution has been removed from the hardware and placed into this software. The meaning of bits in both the key and return values is entirely determined by a combination of the software that constructs the table, and the software running on the processor that makes table lookup requests. This gives the dual benefits of simpler hardware and increased flexibility.

The representation of the table in LTE memory is designed to simplify the lookup engine hardware. The software converts routing tables into this format. This software can run on any conventional processor such as a control plane processor, or a dedicated embedded processor. The software enables a number of useful table features to be implemented:

The key and value sizes can be fixed or of variable length.
Programmable tee de for table size vs. performance trade-offs.
It is possible to include or exclude false hits (tables with false hits are smaller, but require further processing of the result to detect false hits).
Longest prefix matching, with or without false hits.
Optionally, the miss return value can be specified.
Multiple tables can be supported simultaneously.
On a miss, the number of bits matched can be returned.

The software also optimises the placement of table entries in the banks of memory, ensuring that those requiring most accesses are held in the available on-chip memory.

The provision of these capabilities through a software API allows both the underlying software, and the hardware it uses, to be modified, allowing seamless integration of future improvements. To make this software-enhanced approach practical, the memories in the TLE are also directly addressable by any device connected via the ClearConnect bus, allowing the controlling processor access to directly modify the tables as required. A significant feature of the TLE is simultaneous access for both lockup operations and table updates. The entire table can be recomputed and updated in less than a second. An incremental is replacement strategy has been developed that requires only an extra 10% of the table size to be held in memory not an entire second copy of the table.

A 40 Gbit/s Example

At a 40 Gbit/s rate, minimum sized packets will arrive at 100 million per second. As the interpretation of both the key and value can be chosen by the designer, it is assumed that one lookup is required per packet, and thus 100 million lookups per second will be required. However, the TLE does not limit lookup to one per packet.

An Example TLE

Figure 14:
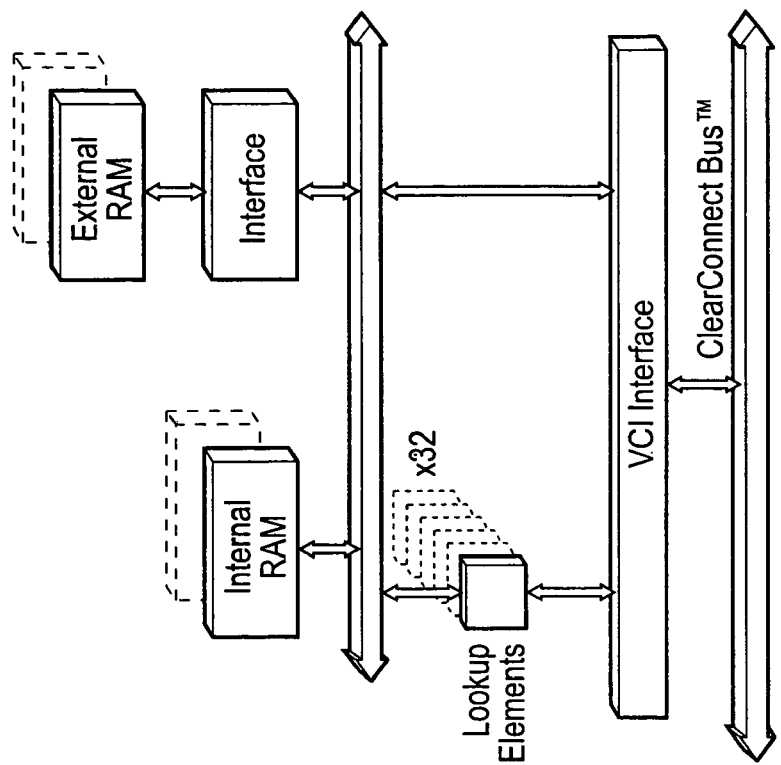
FIG. 14 illustrates a table lockup engine.

The example TLE, shown in FIG. 14, contains, for example, 2 Mbytes of on-chip memory, which is sufficient to hold 330,000 trie entries. This is divided into two banks, each with an access rate of 400M accesses per second. Two banks of off-chip memory with 200M accesses per second are also used. The total amount of memory required is dependent on the key size. The 260,000—entry table used in this example requires a total of between 1.3 and 4.8 Mbytes of memory for key sizes between 32 and 128 bits. A 400 MHz clock and 32 Lookup Elements (LEs) are used.

TLE Performance

Figure 15:
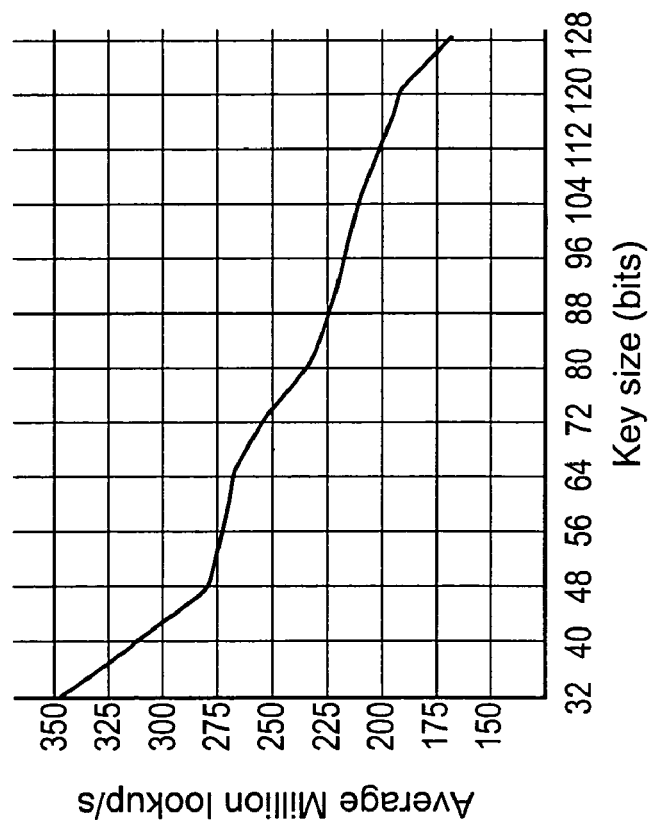
FIG. 15 illustrates TLE performance.

FIG. 15 shows a graph of lookup rate versus key size for accesses of random table entries. A typical Layer 3 lookup consisting of source, destination and TOS requires a 72-bit key. The example TLE would perform 251 million lookups per second in this instance. For the 104-bit five-tuple lockup required at Layer 4, the result is 208 million lookups per second.

Scaling

Figure 6:
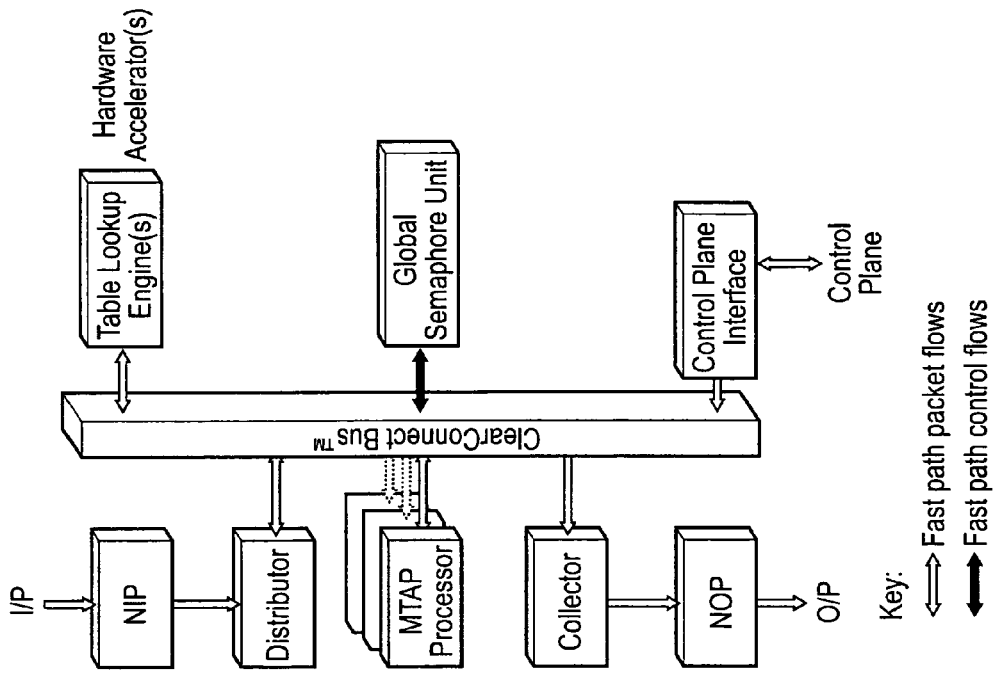
FIG. 6 illustrates a processing subsystem.

The TLE technology is intended to be embedded in an NP solution. This reduces the pin count and power consumption, reducing the overall cost of the solution. FIG. 6 shows a typical environment in which the TLE might be used. It is connected to several other units including packet-processing devices (the packet paths are not shown) and a control processor.

The approach taken is inherently scalable. The sizes of both on-chip and off-chip memories can be selected to meet the required table sizes and performance. Table sizes well in excess of a million entries are possible.

Example TLE Usage

As the design is based on the use of multiple memory banks, it is possible to increase the number of banks, increasing the effective memory bandwidth and thus the overall performance. The number of LEs present in the unit should then be increased. The number chosen should saturate the memory to obtain maximum performance.

The design does not require use of esoteric process technologies, allowing it to use state of the art processes, obtaining improvements in clock speed and memory density as early as possible. For example, using embedded SRAM on a 0.13-micron process, the TLE instance described previously is expected to take 110 mm$^2$ for 2 Mbytes of RAM. The external RAM interfaces would require just 100 pins per bank. It is also possible to include more than one instance of the TLE block within a design.

Encryption Functions

The MTAP processors perform encryption and decryption functions at Gbit rates entirely in software. For faster line rates, the processor is augmented with specialised hardware accelerators, as in the previous description, within the framework of the Platform. The accelerator blocks would implement the low level "inner loop" functions of, for example, DES, 3DES, HMAC-MD5, HMAC-SHA and AES.

Inclusion of these functions as accelerators leaves the PEs free to perform the higher level functions of IPSec: classifying packets for the authentication and/or encryption algorithms to be applied, and maintaining security associations for different flows Control Plane Interface (CPI)

It is assured that the fast path subsystem is connected to a control plane processor for configuration, updates of tables, and the exchange of control packets and other packets that are not processed in the fast path.

The interface block to the control plane is customised for the application. It essentially performs translation and buffering between the control processor's physical environment (such as AMD's HyperTranspor™, RapidIO™ or PCI-X), and the internal transaction format of the fast path subsystem. It will typically contain buffering to match the different packet transfer speeds of the two systems.

Embedded Processor Unit (ESP)

The Network Processor Platform allows the control plane processor easy access to all the on-chip subsystems of the fast path for the purposes of initialisation, control, look-up table updates, data exchanges etc. However, to make the system as efficient as possible it may be desirable to add an Embedded Processor Unit (EPU) to the subsystem in order to relieve the control plane processor from some of these tasks It may also be desirable from a software point of view, in order to maintain a clean hardware/software boundary to the fast path subsystem consisting of an interface block and a software Application Programming interface (API).

The EPU could be any CPU-like component. It can be made responsible for a variety of functions such as:

Primary boot—automatic configuration of the fast path subsystem from e.g. a serial EPROM.

To facilitate hardware and software debug. By providing much of the support for the debugging software on the EPU, the porting exercise for the host specific part would be smaller.

Global Semaphore Unit (GSU)

The Global Semaphore Unit provides a set of memory mapped hardware semaphores to other units on the ClearConnect bus. The number and style of these semaphores can be configured to suit the application. The styles available are simple, counting and tagged. The semaphores are intended to allow software driven synchronisation of multiple software threads and hardware units and ensure mutual exclusion of shared resources in a manner independent of the function of those units.

The Network Processor

The present invention provides, in one broad aspect, not just a series of building blocks for next generation Network Processing but the Network Processor Platform infrastructure required to rapidly construct the core functionality of complete devices.

In one implementation, the platform includes MTAP processors and hardware accelerators, ClearConnect bus, design tools for configuration, simulation and verification of architectures, and an integrated software development environment.

These elements together form a coherent toolkit for advanced Network Processor design.

Component Interconnection

The backbone of the platform is the ClearConnect bus which provides the necessary bandwidth for network processing at 40 Gbit/s. All communication between functional blocks in the system take place over the bus and this, coupled with the standard interfaces used throughout, simplifies the task of constructing and configuring systems.

Traditional on-chip bus structures have a number of limitations that make them unsuitable for general purpose interconnect on Network Processors. Firstly, the bandwidths required dictate that wide paths and high clock speeds are employed. Many bus systems cannot easily scale to meet these demands because of the increasing dominance of interconnect delay in advanced silicon processes. Combined with rising clock speeds and an ever-increasing number of transistors on a chip, the effective "cycle horizon" of logic that can be reached in one clock cycle is rapidly shrinking.

A new approach is required that preserves the simplicity and flexibility of traditional busses, using techniques suitable for next generation SoC design. The ClearConnect bus lies at the heart of the Network Processor Platform technology. It not only meets the performance demands for 40 Gbit/s and above packet processing but also provides the infrastructure on which the Platform technology and SoC design flow environment are built.

The ClearConnect bus includes the following features:
- VCI compliance for Intellectual Property interoperability.
- Flexible topology to facilitate chip floor planning and layout.
- Scalable by section in units of 51.2 Gbit/s, formed from 128 bit wide paths at 400 MHz.
- Segmented to support multiple simultaneous transactions.
- Fully pipelined and split transaction for efficiency.
- Distributed, not centralised arbitration.
- Support for isochronous bandwidth allocation.
- Unified system address space.

The present invention encompasses a processor incorporating such a bus, including any combination of the above-mentioned features.

Platform Architecture

The main elements of the platform have been described above—the MTAP processor cluster, the associated accelerators and the ClearConnect bus. The platform architecture also provides VCI compliant databuffer blocks and interface blocks for the construction of complete packet processing subsystems.

A databuffer is a configurable block providing buffering of one or more queues. It operates on a consumer/producer model and allows for the co-ordination of packet flow through the system. Typical uses for a databuffer are in the distribution of batches of packets to processors in a cluster, or in the exchange of packets between the fast path data plane and the slow path control plane.

An interface is a customisable block which implements data format conversion from a standard or proprietary interface to the appropriate subsystem. Examples of interface blocks would be to physical interface or MAC components, and to control plane processor systems. By encapsulating in these blocks all of the logic required for interfacing the components to a particular hardware environment, flexibility and reuse of hardware/software designs is maximised and clean interoperability is maintained.

Building a Network Processor

In accordance with the teaching of the present invention, a number of processors are combined with data buffer blocks to form a fast path Data Flow Processing architecture for data processing applications. Specific memory and/or hardware engines are added to provide dedicated hardware acceleration for certain application-specific processing functions. The ClearConnect bus is configured to provide the bandwidth needed to interconnect the different blocks in the fast path. Typically this will be explicitly expressed in the ClearConnect bus topology.

Slow path interactions, such as instruction fetch, table maintenance and packets to/from the control plane may use additional common buffers and interconnect. Interfaces are added at the system boundary for clean connection to physical line adapters, switch fabric adapters or other processing stages, including control plane processor.

Figure 5:
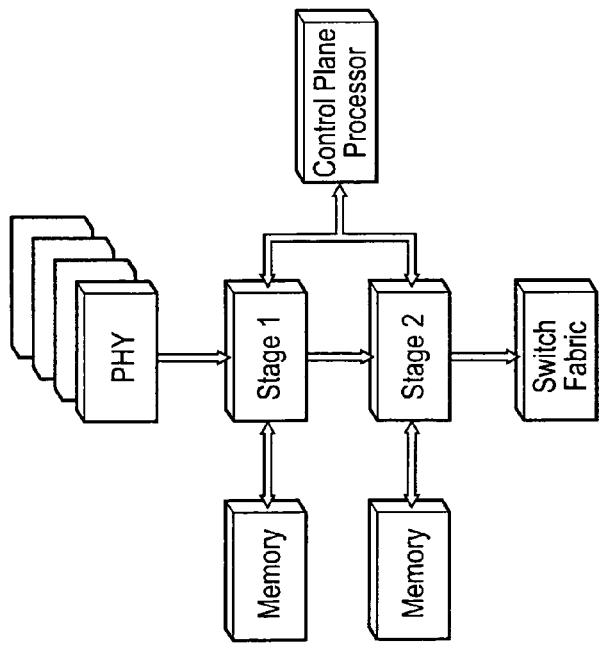
FIG. 5 illustrates an ingress pipeline.

The total system is, in general, partitioned onto a number of these processing sub-systems arranged in a pipeline, as illustrated in FIG. 5. Stages may be identical or have different combinations of building blocks for different functions. One or more such stages may be integrated on a single chip. A number of degrees of hardware/software and headroom trade-offs can be made in partitioning the system.

An Embodiment of the Invention

FIG. 6 shows a simple sub-system example implementation for network layer processing of 100M packets per second at 40 Gbit/s that may be fabricated on a single chip. It includes classification, routing and modification functions. It is implemented as a software solution with a hardware Table Lookup Engine. The clock speed is 400 MHz.

In particular, The MTAP processor communicates via the intelligent "ClearConnect" bus with the Table Lookup Engine (LTE), the Global Semaphore Unit (GSU) and the Control Plane Interface (CPI) Traffic flow follows the general path as described in the aforementioned co-pending application, in that data input passes through a Network Input Processor (NIP) and Distributor into the bus, whereas output-directed data passes through a Collector and a Network Output Processor (NOP) before passing into an output O/P. The NIP and the NOP are both described in the copending application.

The fast path Processing system, in accordance with another aspect of the invention, therefore comprises the intelligent bus as its core. All other blocks, including the NIP/Distributor and the NOP/Collector and the MTAP processor itself, on the one hand, and the TLE, GSU and CPI on the other, are connected via the bus.

Classification and Forwarding

In a traditional ASIC style solution to the network routing problem, the capabilities of the system are defined by the specific operations provided by each hardware functional unit. Even where these units are configurable, solutions are limited to the space defined by the configurability. The Network Processing Platform provides a programmable solution. This offers the dual benefits of offering the application developer much greater flexibility whilst simplifying the hardware, allowing for its greater optimisation.

This flexibility allows:
- Scalability of performance. The same software can run on different numbers of processing elements, allowing products that operate at greater or lower line rates.

Scalability of features. Using the same hardware, a tradeoff between feature set and performance can be made with reduced design effort.

A single hardware implementation can offer multiple feature sets by changing only software. Changes can even be made after a product has begun shipping. This degree of flexibility is especially important when provisioning support for protocols that are still under development, such as MPLS.

This part of the description relating to an example application has been restricted, for clarity and brevity, co Layer 3 functionality. The programmable approach offered by the present Network Processing Platform is equally appropriate for application at Layer 4 or above. In particular, Layer 3 and Layer 4 processing would normally be combined.

Multi-Protocol Example

The example data plane software represents a high-end network layer Internet packet processing system. It has simultaneous support for IPv4, IPv6 and MPLS protocols. The functions supported are:

Transmission Error Detection

IPv4 packets have their header checksum verified. In addition, this field is adjusted to reflect any modifications to the packet header.

Forwarding/Routing

Egress part numbers, queue identifiers and forwarding level of service characteristics are determined by performing a table lookup using a key constructed from various fields taken from the packet header.

IPv4 packets are forwarded as a function of their source address, destination address and type of service field. IPv6 packets are forwarded as a function of their source address, destination address, traffic class and flow label fields. For unicast packets a largest prefix match is performed on the destination address. Multicast packets are forwarded by performing an exact match on the source and destination addresses. MPLS packets are forwarded as a function of their label value and quality of service fields. In the most basic case this is a simple label swapping operation. However, more complicated behaviour typical of edge MPLS nodes is also supported. This functionality is described in the section on tunneling.

Data Validation

Validation of the packet fields is performed. For example, the internet header length field of IPv4 packets is checked against the permissible range [5 . . . 15]. All network layer exceptions are detected and, when they arise, the control plane processor is directed to generate an appropriate ICMP response, if necessary.

Identification of Specialized Packet Types

Unusual packets are identified in the data plane and forwarded to the control plane for specialised processing. For example, IPv4 packets with header options, and IPv6 packets with a hop by hop extension header are treated in this manner.

Quality of Service

As previously described, the table lockup operation that determines egress port numbers, queue identifiers and forwarding level of service characteristics is a function of networking layer QoS fields.

Tunneling

IPv4 or IPv6 packets are tunnelled in or de-tunnelled from IPv4 tunnels at line speed in the data plane as necessary. It is the responsibility of the control plane to set up tunnel mappings in the first instance.

One or more MPLS labels may be prepended to or removed from incoming IP or MPLS packets as specified by the forwarding table. Time to live, hop limit, and QoS field copying is performed as appropriate.

Statistics Gathering

Sixteen counters for the SNMP Internet MIBII are maintained at line speed in the data plane. They are continuously gathered and forwarded to the control processor.

Packet Lifetime

IPv4 packets have their time to live field decremented. IPv6 packets have their hop limit field decremented. MPLS packets have their copy of the time to live field or hop limit decremented. In each case if the counter reaches zero then the packet is discarded and the control plane processor is directed to generate an appropriate ICMP response.

Multicast

If the destination address of an IP packet is a multicast address then the packet is forwarded to multiple egress ports as appropriate. Similarly, examination of an MPLS label may result in copies of the packet with differing outgoing labels being directed to multiple egress ports.

In each case the multicast mechanism allows different queuing and level of service to be associated with each copy of a single multicast packet.

Performance Requirements

Processing a 40 Gbit/s data stream requires exceptional memory bandwidth and processing power. This section provides a basic overview of the performance constraints in which the functionality described above must be delivered. The minimum TCP/IP packet size is 40 bytes (a TCP ACK packet) and thus, in theory, the maximum TCP/IP packet rate in a 40 Gbit/s data stream is 125 million packets per second. However, a small portion of the bandwidth available in a data stream is usually consumed by datagram framing. This typically represents an overhead of at least 8 bytes per packet transmitted. If a 40 Gbit/s data stream consisted entirely of minimum sized TCP/IP packets and the framing overhead per packet was 8 bytes then an associated packet processing system would have to process 104 million packets per second. This represents a packet processing time of 9.6 ns. A high performance network processing solution must be capable of processing traffic streams that exhibit this traffic profile for prolonged periods.

Figure 7:
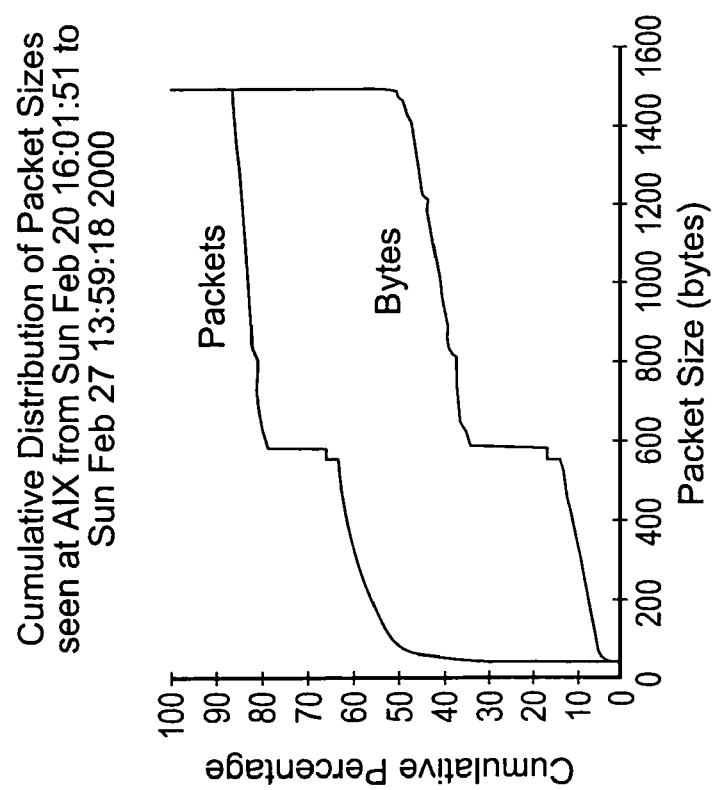
FIG. 7 illustrates a traffic profile trace.

In practice, traffic profiles contain many non-minimum sized packets. FIG. 7 shows a traffic profile trace collected from the NASA Ames Internet exchange (AIX) in Mountain View, Calif.

Traffic profile surveys demonstrate that the average packet size in a TCP/IP network is usually much larger than 40 bytes. An average packet size of around 4,000 bytes is common. Under such conditions significant headroom should be available for performing higher layer processing. Typical core routing tables are already greater than 100,000 entries in size. It is expected that the next generation of tables will provide one million entries in order to support multiple protocols. In addition to accommodating the 40 Gbit/s line traffic, significant bandwidth must be provisioned to provide access to state information such as forwarding tables. For example, if a 125-hit key is looked us for each packet then, at 104 million packets per second, this represents a 13 Gbit/s data stream.

Processing Architecture

The present invention couples a very powerful programmable parallel processor with highly optimised hardware accelerators, in a modular and scalable platform. This platform is specifically designed for extreme bandwidth Data Flow Processing applications. The unique processor architecture in accordance with the invention operates on is tens or hundreds of data items simultaneously. This provides the performance required for flexible processing at very high packet rates.

Special purpose hardware engines, or accelerators, provide maximum efficiency for the simple common functions of packet processing.

Communication between the processor and the hardware accelerators is pipelined over a high-speed bus, the ClearConnect™ on-chip network. The I/O structures of the processor perform the parallel to serial conversion, and vice versa, within the processor.

Each block in the Network Processing Platform conforms to the VCI specification for virtual component inter-operability. Instruction flow is common to all the Processing Elements (PEs) in a given processor. However it is subject to data-dependent modification in an extensive range of enhancements to the basic SIMD processing model. Combined with novel software techniques, the processor's hardware model can exceed the efficiency of alternatives, even when the packet stream demands a variety of different protocols to be applied.

The remainder of this part of the specification describes how this is achieved for the example of performing network layer processing on IPv4, IPv6 and MPLS packets.

System Overview

Referring back to FIG. 6, the principal components of the example network layer processing system are depicted. These items could represent the whole, or part of a single chip. The Network Input Port (NIP) and Network output Port (NOP) blocks convert between physical signalling protocols and the standard internal packet format used in the sub-system. The Distributor buffers incoming data from the NIP and transfers the data to the processor. The name "Distributor" is is derived from the block's capability to forward incoming data to multiple PEs. Conversely, the Collector buffers data sent by the PEs and multiplexes it into a single stream to the NOP.

The Table Lookup Engine (TLE) is a special purpose memory controller block that, at a functional level, manages a table of (key, value) pairs. Given a variable length input key it returns the value associated with the longest matching key stored in the table.

A single processor consists of a number of processing elements and I/O engines with their associated controllers. FIG. 4 shows the major units within a processor. The control plane interface provides access to the fast path system and buffers packet data sent between the processor and the control plane.

The ClearConnect bus is a high-speed extensible interconnection network that provides for concurrent communication with localised, distributed arbitration. It provides point to point connections and thus different data can flow concurrently on different segments. This means that incoming packets flowing from the NIP to a processor can share the network with outgoing packets flowing from a processor to the NOP. Co-ordination of the different processors in the system is achieved through software by means of shared hardware semaphores. A block of general-purpose semaphores is provided as a stand-alone unit connected to the ClearConnect bus. These can be used by software to synchronise system operation at a logical level.

System Operation

Packet data flows from an external input to the NIP where it is transformed into the standard internal packet format used in the sub-system and fed to the Distributor.

The Distributor buffers incoming packet data. It forwards batches of packets to a processor when requested. The amount of packet data in a given batch of packets is (almost) constant while the number of packets in the batch varies in accordance with the distribution of packet size. Small packets are allocated to individual PEs within a processor. Large packets are allocated to a number of PEs sufficient for their storage.

The processors perform the main data plane processing. They decide for each packet whether to drop, forward, or send to the control plane. Each processor handles a batch of packets, the entire contents of which are distributed across its PEs. For network layer processing, only the PEs containing the header content of packets are active. The others remain idle in a power saving mode, as previously indicated.

Packets to be forwarded are sent from the processor to the Collector, which buffers and sends them to the NOP. The software running on the processors in a cluster enables them to co-ordinate with each other in a round-robin fashion to input, process and then output batches of packets. This preserves global packet order through the system.

Hardware multi-threading is supported to provide for programmed overlap of operations. In this example, each processor runs the same program. This program contains four threads:

1. A packet loading thread schedules the transfer of packet data from the Distributor into the local memory of the PEs in the processor.

2. A packet processing thread performs general purpose processing on the set of packets stored across the PEs in the processor.

3. A lookup thread manages the issue of lookup requests to the Table Lookup Engine allowing them to run concurrently with other packet processing.

4. A packet unloading thread schedules the transfer of packet data from the local memory of PEs in the processor, to the Collector.

Each PE accommodates multiple logical data buffers in its local memory in which packet data is stored. This allows new packet data to be loaded while the current packet data is being processed and old packet data is unloaded.

General-purpose semaphores are used to manage contention for shared resources such as PE memory buffers, access to the Distributor for read requests and access to the Collector for write requests.

Figure 8:
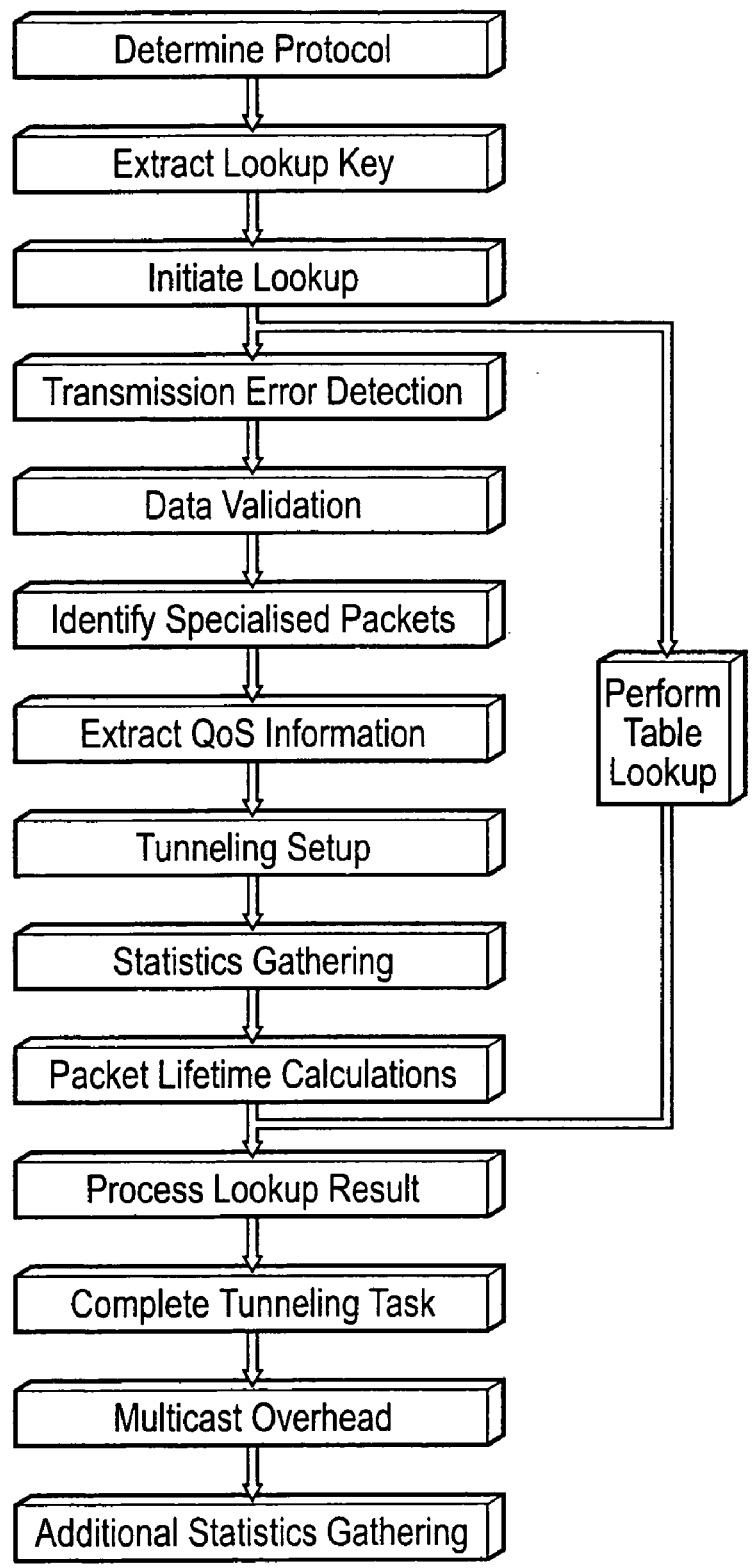
FIG. 8 illustrates overlap of processor operations.

The threads are structured so as to maximise the overlap of operations. FIG. 8 illustrates the overlap between packet processing and table lookup for a single processor.

The processors synchronise with ocher processors and hardware accelerators via semaphores. In this example the global semaphores are used to keep the processors in step with one another but out of phase.

At any time, one processor is being loaded with data, another one is being unloaded, and all the processors can be processing and doing lookups. This allows continuous streaming to the processors from the Distributor and from the processors to the Collector. The lookup activity is spread over time in n phases from n processors and thus the Table Lookup Engine is used continuously.

Figure 9:
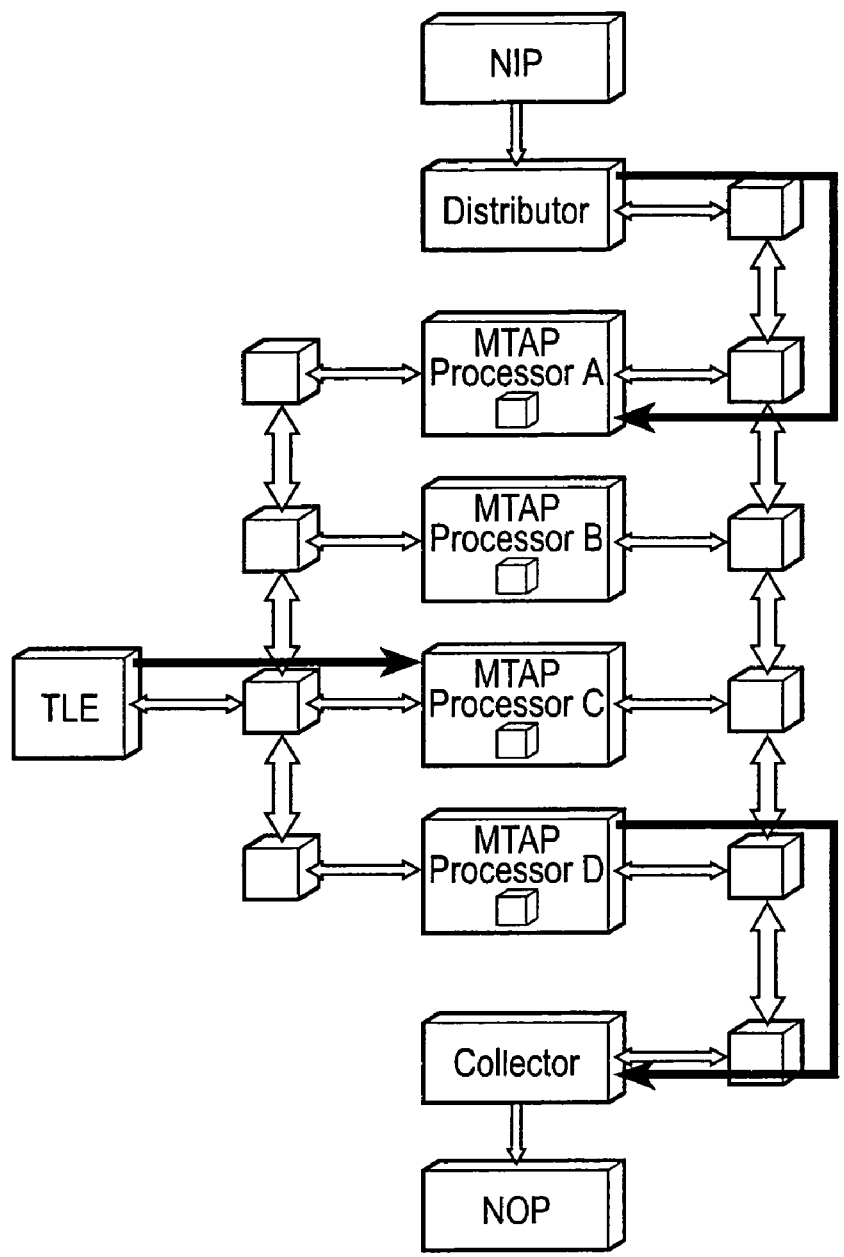
FIG. 9 illustrates system behaviour.

FIG. 9 shows a snapshot of such system behaviour. It highlights the concurrency of operations. Every processor is processing a set of packets stored in its PEs' local memory. Simultaneously, processor A is loading a new set of packets from the NIP, processor D is unloading a set of packets to the NOP, and processor C is receiving the result of a batch of table look-up operations from the Table Lookup Engine. The movement of data throughout the system does not interfere with the processing of packet data already stored within the local memory of the PEs.

All Processing Elements in a single processor execute a single common instruction stream. This instruction stream is designed to handle multiple protocols at once. One PE may be processing an IPv4 packet while another processes an IPv6 packet and yet another processes an MPLS packet. It is natural to imagine that this requires the single instruction stream to have three stages—one for IPv4 processing, one for IPv6 processing and one for MPLS processing. In reality, multiple protocols tend to address overlapping problem domains and consequently they have a high degree of commonality of function. Exploiting this inherent functional overlap minimises the code size and execution time.

A number of advanced capabilities have been added to the processors, taking them beyond traditional, limited parallel processing architectures. This allows them to perform tasks where the array of data items cannot simply be processed with a sequence of identical operations.

These techniques fall into two broad areas:

Data driven modification of operations at the PE level, which allow different PEs to handle different protocols. These include predication, memory indexing, selective I/O and addressing modes.

Global control structures that maintain optimum operation of the PE array as a whole. These include global data-driven instruction flow and thread switching, and programmed overlap of the processor with I/O operations.

Figure 10:
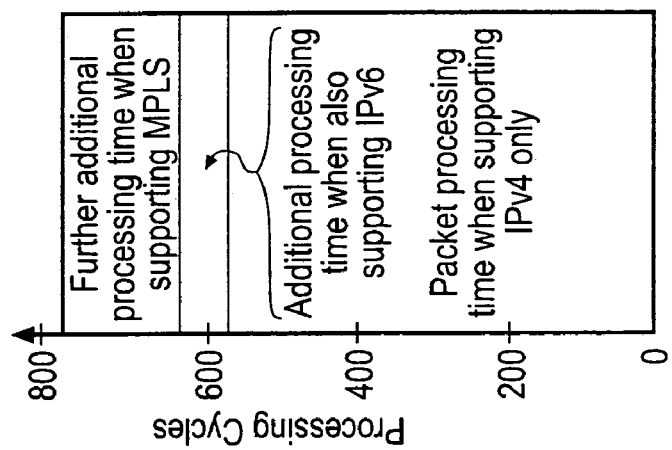
FIG. 10 illustrates support of multiple protocols.

The significant amount of processing that is functionally common across multiple protocols is performed on different packet types in parallel for the minor expense of a one-time cost of setting up data dependent pointers to functionally common packet fields. Where necessary, predication is used to restrict specialised processing to particular packet types. As a result, only incremental overhead is required to support additional protocols once a base protocol has been supported. FIG. 10 shows the break down of cycle expenditure for the three protocols supported in the example.

Processor wide state is examined in parallel and global flow of control decisions based on the results. For example, if no packet in a batch of packets requires tunnelling then the tunnelling code is bypassed.

If a packet requires multiple processing passes then, once the first processing pass is completed, the packet is retained in the processor. The next processing pass can then take place in common with the next batch of packets. For example, when de-tunnelling an MPLS packet the first pass strips off the outermost MPLS tag and modifies the enclosed packet as appropriate (e.g. copies back QoS and TTL information). The processor then retains this packet so that the remaining MPLS tags can be stripped off, if necessary, in subsequent passes. Potentially, at some point a final MPLS tag may be stripped off, in which case the enclosed (IP) packet is again retained to be processed in the next pass along with the next batch of incoming packets. Because all packets in a flow will be treated the same way, this approach preserves packet order within flows, although it may reorder packets from different flows.

Performance

Figure 11:
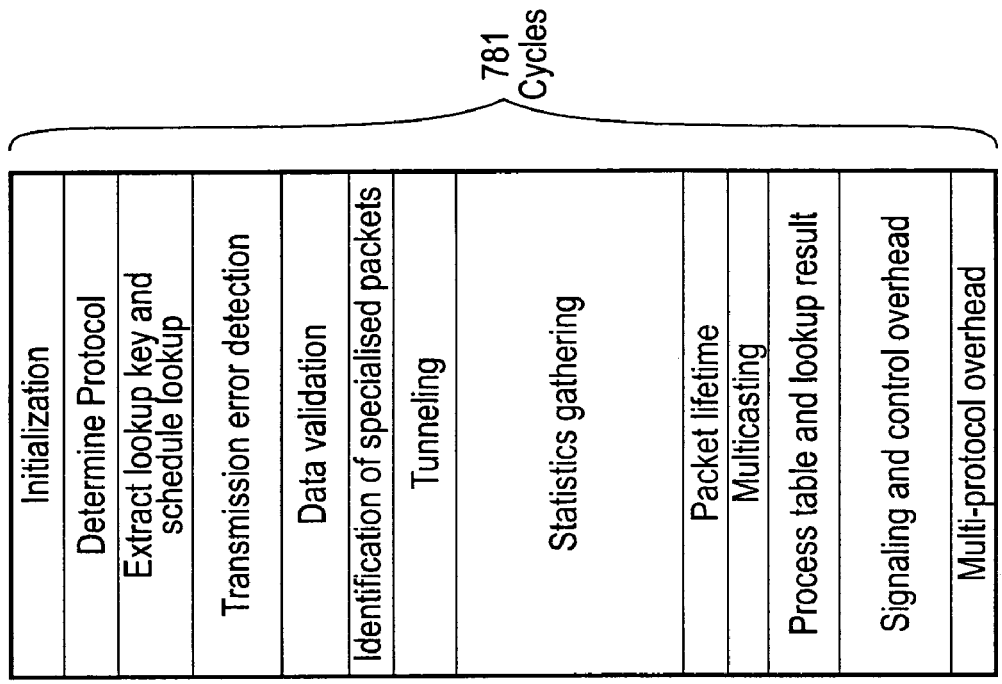
FIG. 11 illustrates cycle expenditure.

FIG. 11 shows the breakdown of cycle expenditure by function. Some initialisation is required to prepare the data dependency pointers that allow multiple protocols to be processed at once. Additional multi-protocol overhead is incurred deciding which operations are relevant to a particular packet instance. The signalling and control overhead cost accounts for the time consumed implementing the software's flow of control. This category of cycle expenditure is typical of any software system. It covers items such as branch delay, thread switching and signalling and waiting on semaphores. A single Processing Element performs the multi-protocol network layer processing functionality presented above in 781 cycles. At a clock speed of 400 MHz this represents a processing rate of just over one half million packets per second. A number n of such processing elements can provide a sustained processing rate of approximately n/2 million packets per second. A network processing system may be configured to provide a desired level of performance by, amongst other things, choosing an appropriate value for n. The performance requirements section of this specification demonstrated that a 40 Gbit/s data stream of minimum sized packets demands a processing rate in excess of 104 million packets per second. This performance point may be accommodated with 25% headroom by the following system configuration:

| | |
|---|---|
| Clock rate in MHz | 400 |
| Processors | 4 |
| PEs per processor | 64 |
| Kbytes of local memory per PE | 4 |

Partitioning the 256 Processing Elements into four processors reduces the latency experienced by packets passing through the system. A batch of up to 64 packets is loaded into a processor, processed and then unloaded. A packet loaded and unloaded within a batch of 64 40 byte packets at 40 Gbit/s experiences a load/unload delay due to batching of approximately 0.5 µs. Adding this to the processing time of almost 2 µs gives a system processing latency of 2.5 µs. Providing each Processing Element with 4 Kbytes of local memory enables a single processor to multi-buffer individual packets of up to 64 Kbytes in size.

The system's packet-processing rate is matched by a Table Lock Engine configuration that can service 125 million lockups per second. These lookups are directed at a table that stores 1 million entries with an average key size, for this example, of 48 bits. Simulations demonstrate that this performance level can be achieved using a Table Lookup Engine configuration that uses 2 Mbytes of on-chip memory, and 16 Mbytes of off chip memory in two channels. Off chip memory is 36 bits wide DDR SSRAM with a clock speed of 200 MHz.

Figure 12:
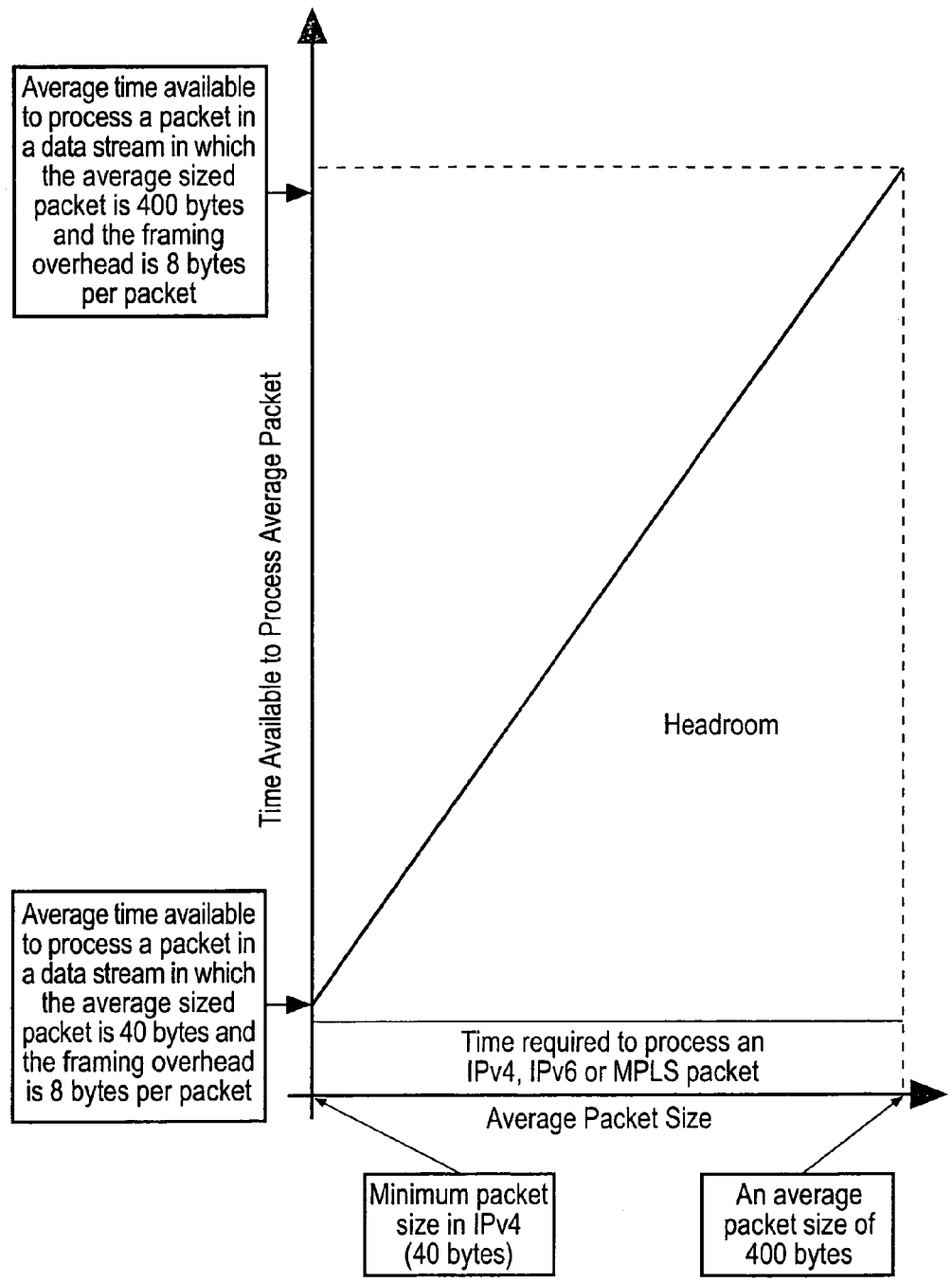
FIG. 12 illustrates headroom compared to packet size.

For real-world traffic profiles where the average packet size is often approximately 400 bytes there is significant headroom available for performing additional work such as layer 4 to 7 processing. FIG. 12 shows the headroom availability as a function of the average packet size in a packet stream.

System Metrics

The estimated cost of the example system configuration in terms of die area, power consumption and pin count for a 0.13µ process have already been mentioned, The following items are included in this costing:

1. A high speed serial I/O path for packet data.
2. An example NIP, NOP and CPI.
3. A Distributor and a Collector.
4. 4 processors of 64 PEs each.

5. A TLE with 2 Mbytes of on-chip memory and 16 Mbytes of off-chip memory.
6. A global semaphore block.
7. A high speed on chip network of sufficient bandwidth to accommodate the packet stream, table lookup I/O and additional control data I/O.

Scalability

Each of the blocks (hardware/software) within the Network Processor Platform, including the processor, ClearConnect bus and Table Lookup Engine (TLE), is designed, in accordance with a yet further aspect of the invention, to be fundamentally scalable. System software runs unchanged across solutions of different scale. For example, smaller, cheaper or lower power solutions can be produced by any combination of:

reducing the clock frequency
reducing the number of processors,
reducing the numbers of PEs in a processor,
reducing the size of on-chip memories, and
scaling down the width of the ClearConnect bus.

Each of these options, which constitute preferred sub-sets of this aspect of the invention, provides different benefits and tradeoffs in terms of cost, performance, power consumption, etc. A 10 Gbit/s solution could readily be constructed in this manner. Conversely, these characteristics an also be scaled up to achieve 80, 100 and 160 Gbit/s performance points. An 50 Gbit/s solution may consist of twice as many processors as a 40 Gbit/s solution. It may also use twice as many ClearConnect lanes, and a TLE with twice the number of Lookup Elements (LEs) and memory banks to deliver double the lookup performance. Input and Output ports would also need to be uprated to handle the corresponding increase in line race. This scaling up discussion assumes no increase in system clock rate. If clock rate increases are also available, the scaling factor we have applied so far could decrease correspondingly. For example, consider a processor running at 400 MHz with 64 PEs. Increasing its clock rate by 1.5× to 600 MHz delivers the same performance increase as increasing the number of PEs by 1.5× to 96, but keeping the clock rate at 400 MHz.

By leveraging the scalability of both the number and performance of the Network Processor Platform blocks, system designers will be able to deliver a solution at their required price/performance point in a timely fashion. This embodiment, providing network layer processing at line speeds of 40 Gbit/s and above, requires a rich set of fast path functionality in order to reduce the burden on the control plane slow path. The Network Processor Platform is based around fully programmable processing cores which allow a wide range of fast path functions to be performed, while maintaining wire speed with a throughput of over 100 million packets per second. The network layer solution is easily scaled down for 10 Gbit/s applications and no architectural or software changes are needed to scale up to 160 Gbit/s. Between these points a number of hardware and software trade-offs can be made to target specific functionality, performance and headroom requirements.

In summary, the exemplary Network Processor consists of a cluster of typically four MTAP processors connected via the ClearConnect bus to databuffer blocks Distributor and Collector. These databuffers manage the distribution and collection of variable numbers of packets in response to requests made by the software running on the processors. Typically, the software enables them to co-ordinate with each in round-robin mode to input, process and then output batches of packets. This preserves the global packet order Air through the system.

Each processor handles a batch of packets sufficient to fill the local memories of its PEs. In effect it consumes a near constant amount of line bandwidth per processing phase, rather than a constant number of packets. In this way, the processing flow is directly matched to the line flow at the data bit level, and results in very low packet jitter.

The fast path interconnect uses a pair of 128 bit interconnect structures to provide a peak transfer bandwidth of 102.4 Gbit/s. This carries the 40 Gbit/s traffic with more than sufficient headroom to cover additional packet tag data, packing losses and unused cycles.

The solution described can be implemented as a single chip. Using high-speed serial I/O structures For packet input and output, the chip is 295 mm$^2$ at $0.13\mu$ in a 700 pin package and consumes an estimated maximum 17 W of power, as already mentioned.

Interface blocks NIP (network input port) and NOP (network output port) are customised to interface to the preceding and subsequent processing stages. These could be physical line interfaces to OC768c or four 10 Gbe MACs, for example, or input/output interfaces to a switch fabric. Interface blocks are not required between different processing stages but only at the boundaries. The Control Plane Interface (CPI) block provides controllability and observability of the fast path, and packet exchange paths between the fast path Network Processor system and the control plane processor.

The Software Component

Software is an essential part of the Network Processor Platform. Optimised example fast path code and a comprehensive set of development tools lower the software barrier that can impede the adoption of a new processing architecture. In addition, the software platform is designed for maximum interoperability with existing assets—both for the fast path, through a C compiler, and a clean interface to the slow path through an API.

The modularity of the hardware architecture, with configurable MTAP processors married to configurable hardware accelerators, is mirrored in the modular structure of the software too. The overall Platform combines hardware and software tools into a complete system on-chip design flow. In addition, the use of a common processor for all programmable functions reduces the number of fast path programming environments to one.

Functionality is put into software in order to improve flexibility, maintainability and to avoid so-called "forklift" upgrades. This is achieved with several professional suites of tools aimed at Linux and windows platforms which can be considered in three categories: hardware development kit (HDK), software development kit (SDK) and application development kit (ADK).

The HDK suite consists of those tools that are used to configure and design silicon and hardware. For example, a visual tool and supporting libraries that enables simulation and verification, throughout the design process, of large system on a chip solutions. The HDK also includes verification suites and a harness with cross-platform support.

The SDK contains all the tools necessary for developing software for the Network Processor Platform. The SDK will be supported on several platforms including Linux and Windows 2000®. The SDK includes a configurable architectural simulator and a C compiler. This allows software development to proceed in parallel with, or in advance of, hardware development. All of the SDK tools will work with either the architecture Simulator or the real hardware in an identical manner.

The compiler is based on ANSI C, but with additional native support for the parallel data types processed by the MTAP architecture. There is also a debugger that provides all of the standard debugging facilities (breakpoints, single-step, inspection of registers and memory, etc.). The debugger supports source-level debugging of both C and assembler code. The profiler allows the performance of code running on the target system to be analysed. It shows instruction usage, stalls, overlap of I/O and processing, etc.

The ADK suite consists of tools and libraries specifically intended for Network Processing applications. Multiple sample fast paths and libraries are supplied in source and object form. Additional simulation tools are provided to generate and check packet streams. There are also tools to support application-specific hardware accelerators such as the TLE. The ADK content is based on applicant's extensive hands-on experience developing reference network processing code for the MTAP architecture. The ADK allows customers to go beyond the supplied sample applications and create their own unique, value added solutions.

Platform Scalability

Many Network Processing solutions claim to be scalable, in the sense that the number of processors can be increased, or pipelines lengthened, to achieve higher performance points or greater functionality. However, many of these are based on architectures that were designed for 1 Gbit/s or 2.5 Gbit/s applications, and begin to hit scalability limits as they are stretched to 10 Gbit/s and beyond. For example, as a cluster of CPUs is extended beyond around sixteen, access mechanisms to shared resources become inefficient, and problems of synchronisation and non-determinism become increasingly difficult to handle.

By contrast, the present Network Processor Platform is specifically designed to meet the challenges of next generation network systems. The architecture is suitable for 10 Gbit/s to 160 Gbit/s applications, and the possible solution points are limited only by the prevailing technology factors. In addition, the highly modular nature of the hardware and software components of the Network Processor Platform allow a wide variety of different packet processing functions to be implemented with a relatively small set of components. The Network Processor Platform is a very powerful 'toolkit' for Network Processor designers.

The dimensions of scalability in the architecture are:
Number of PEs in a processor.
Number of processors in a cluster.
Number and type of hardware accelerators.
Number of "lanes" in the ClearConnect bus.
Functionality vs. performance defined in software.
Number of processing stages in a pipeline.
Clock speed.

Any or all of these options may be utilised, in accordance with the invention, to effect scalability. The fine-grained parallel processor architecture of the MTAP processor means that the incremental cost of adding processing power is low. The latency immunity that is built in to the MTAP operation and the pipelined packet data flow throughout the system mean chat clock speeds can be increased and little efficiency lost to the shrinking 'cycle horizon' that results from building large chips on ester smaller geometries. The common format of hardware accelerators, conforming to the VCI interface, allows new capabilities to be added to the technology platform in a seamless way. Additional hardware engines may be added by customers or third parties.

A line card solution at 10 Gbit/s could be readily built with current technology. Scaling in the above dimensions will soon yield a 40 Gbit/s solution, as outlined in the example given above. Only at the 100 Gbit/s point do scaling limits begin to be reached in terms of the number of processors sharing resources, or the efficiency of packet transport through the ClearConnect bus. The biggest problem at this performance is providing the capacity and bandwidth for the packet queue memory in the traffic management function.

CONCLUSION

The twin demands of intelligent Internet functionality and ever increasing network bandwidths demand-powerful yet flexible solutions for packet processing. The present Network Processor Platform supplies a solution to these next generation needs in the form of a hardware and software Platform that can be rapidly integrated with existing systems. It is applicable to the processing of all network layers and complex traffic engineering functions.

The deployment of large scale parallelism in programmable processors and optimised hardware pipelines for specific generic functions, integrated in a scalable interconnection network, provides the ideal combination of software defined functionality at near-ASIC price performance points. The Network Processor Platform architecture scales for efficient solutions between 10 Gbit/s and 160 Gbit/s with minimal changes to hardware or software components.

It will be readily appreciated that the approaches described in the above description can be applied to a wide variety of processor systems, and not just network processors. Such processor systems can be implemented on a single integrated circuit, or across several integrated circuits. A particularly advantageous methodology for constructing such a processor system is to use a number of functional building blocks to build up the required overall functionality.

The invention claimed is:

1. A data processing architecture comprising:
   an input device for receiving an incoming stream of data packets of unpredictable size; and
   a plurality of processing elements which are operable to process data received thereby;
   wherein the input device is operable to distribute batches of data packets of unpredictable size across said processing elements such that the number of said processing elements across which each data packet is distributed is dynamically determined based at least in part on the size of the data packet;
   a data packet greater than a predetermined size being divided into portions and each portion distributed to a respective processing element; and
   a data packet less than a predetermined size being distributed to a single processing element;
   wherein the data processing architecture is operable to process at least one data packet at a time, wherein the processing elements are arranged in a SIMD array and operable to process different respective packet protocols at once while executing a single common instruction stream.

2. A data processing architecture as claimed in claim 1, wherein each processing element is operable to process data stored by that element in accordance with processing steps determined by the data concerned.

3. A data processing architecture as claimed in claim 1, wherein a data packet is allocated to as many processing elements as are necessary to store said packet and to process said packet.

4. A data processing architecture as claimed in claim 1, wherein the portions are of a fixed size.

5. A data processing architecture as claimed in claim 1, wherein the input device is operable to transfer data packets to the processing elements such that not all processing elements receive data.

6. A data processing architecture as claimed in claim 1, wherein the processing elements are operable to control the transfer of packet portions to the processing elements from the input device.

7. A data processing architecture as claimed in claim 6, wherein the processing elements are operable to control the input device by means of software.

8. A data processing architecture as claimed in claim 1, wherein the processing elements are operable to control the transfer of packet portions from the processing elements to an output device.

9. A data processing architecture as claimed in claim 8, wherein a plurality of said input device and said output device form part of a plurality of input/output systems, operable to transmit data to, and receive data from, the processing elements and adapted to support multiple input/output operations.

10. A data processing architecture as claimed in claim 8, wherein said output device is operable to collect processor data packets from the processing elements and to construct an outgoing data packet stream from collected processor data packets.

11. A data processing architecture as claimed in claim 8, wherein said input device and said output device are part of an input/output system operable to transmit data to, and receive data from, the processing elements.

12. A data processing architecture as claimed in claim 1, comprising a single instruction multiple data (SIMD) data processing architecture,
wherein at least one processing element is operable to enter a standby mode of operation in dependence upon data received by that processing element.

13. A data processing architecture as claimed in claim 12, wherein the at least one processing element is operable to enter the standby mode of operation when no data is received.

14. A data processing architecture as claimed in claim 12, wherein each processing element is operable to process data stored by that element in accordance with processing steps determined by the data concerned.

15. A data processing architecture as claimed in claim 12, implemented on a single integrated circuit.

16. A data processing architecture as claimed in claim 12, implemented on a plurality of integrated circuits.

17. A data processing architecture as claimed in claim 12, wherein the data processing architecture is implemented in a processor.

18. A data processing architecture as claimed in claim 1, comprising a first plurality of parallel arrays of processing elements, and a second plurality of hardware accelerator units.

19. A data processing architecture as claimed in claim 1, comprising a plurality of parallel arrays of said processing elements, and a data input/output system which is operable to transfer data to and from the arrays of processing elements in turn.

20. A data processing architecture as claimed in claim 19, wherein each processing element is operable to process data stored by that element in accordance with processing steps determined by the data concerned.

21. A data processing architecture as claimed in claim 19, implemented on a single integrated circuit.

22. A data processing architecture as claimed in claim 19, implemented on a plurality of integrated circuits.

23. A data processing architecture as claimed in claim 19, wherein the data processing architecture is implemented in a processor.

24. A data processing architecture as claimed in claim 1, comprising a plurality of functional blocks chosen from: a single instruction multiple data (SIMD) processing element array, a data input device, a data output device, a hardware accelerator, a data packet buffer and a bus structure for connecting the functional blocks to one another.

25. A data processing architecture as claimed in claim 1, implemented on a single integrated circuit.

26. A data processing architecture as claimed in claim 1, implemented on a plurality of integrated circuits.

27. A data processing architecture as claimed in claim 1, wherein the data processing architecture is implemented in a processor.

28. A data processing architecture as claimed in claim 1, wherein each processing element is operable to process data stored by that element in accordance with processing steps determined by the data concerned.

29. A data processing architecture as claimed in claim 1, implemented on a single integrated circuit.

30. A data processing architecture as claimed in claim 1, wherein processing is only performed by processing elements containing packets or packet portions carrying a header.

31. A data processing architecture as claimed in claim 1, wherein processing is performed by multiple processing elements containing portions of a packet, in dependence on either data in the packet or information about the packet.

32. A data processing architecture as claimed in claim 1, wherein the number of processing elements is determined based on a bandwidth and an amount of required processing.

33. A data processing architecture as claimed in claim 1, wherein the size of the packet portions is determined based on a bandwidth and an amount of required processing.

* * * * *